US012648183B2

(12) United States Patent (10) Patent No.: US 12,648,183 B2

Toda et al. (45) Date of Patent: Jun. 2, 2026

(54) SEMICONDUCTOR DEVICE AND SEMICONDUCTOR MEMORY DEVICE

(71) Applicant: Kioxia Corporation, Tokyo (JP)

(72) Inventors: Masaya Toda, Yokkaichi (JP); Kazuhiro Matsuo, Kuwana (JP); Kota Takahashi, Yokkaichi (JP); Kenichiro Toratani, Fujisawa (JP); Shosuke Fujii, Kuwana (JP); Shoichi Kabuyanagi, Yokkaichi (JP); Masayuki Tanaka, Yokohama (JP); Wakako Moriyama, Yokohama (JP)

(73) Assignee: Kioxia Corporation, Tokyo (JP)

( * ) Notice: Subject to any disclaimer, the term of this patent is extended or adjusted under 35 U.S.C. 154(b) by 401 days.

(21) Appl. No.: 18/341,865

(22) Filed: Jun. 27, 2023

(65) Prior Publication Data

US 2024/0321995 A1     Sep. 26, 2024

(30) Foreign Application Priority Data

Mar. 24, 2023     (JP) ................................. 2023-048944

(51) Int. Cl.
H10D 30/67     (2025.01)
H10B 12/00     (2023.01)
(Continued)

(52) U.S. Cl.
CPC ......... H10D 30/6739 (2025.01); H10B 12/30 (2023.02); H10B 12/33 (2023.02);
(Continued)

(58) Field of Classification Search
CPC ............... H10D 30/6739; H10D 30/43; H10D 30/6757; H10D 99/00; H10B 12/30; H10B 12/33
See application file for complete search history.

(56) References Cited

U.S. PATENT DOCUMENTS 7,812,391 B2     10/2010   Matsuo et al.
8,008,707 B2     8/2011    Matsuo et al.
(Continued)

FOREIGN PATENT DOCUMENTS

JP     2009170781 A     7/2009
JP     2020120123 A     8/2020
(Continued)

OTHER PUBLICATIONS

U.S. Appl. No. 17/930,889, First Named Inventor: Yuta Saito; Title: "Semiconductor Device and Semiconductor Memory Device", filed Sep. 9, 2022.

*Primary Examiner* — Jeff W Natalini

*Assistant Examiner* — Rose Keagy

(74) *Attorney, Agent, or Firm* — Holtz, Holtz & Volek PC

(57)     ABSTRACT

A semiconductor device of embodiments includes: a first electrode; a second electrode; an oxide semiconductor layer provided between the first electrode and the second electrode and including a first region, a second region, and a third region between the first region and the second region; a gate electrode facing the third region; a first insulating layer facing the first region; a second insulating layer facing the second region; and a gate insulating layer between the gate electrode and the oxide semiconductor layer, containing oxygen (O) and at least one metal element selected from a group consisting of Al, Hf, Zr, La, Y, Zn, In, Sn, and Ga, and having a chemical composition different from that of the oxide semiconductor layer.

19 Claims, 20 Drawing Sheets

(51) Int. Cl.
    *H10D 30/43*        (2025.01)
    *H10D 62/10*        (2025.01)
    *H10D 64/20*        (2025.01)
    *H10D 99/00*        (2025.01)

(52) U.S. Cl.
    CPC ......... *H10D 30/43* (2025.01); *H10D 30/6757*
        (2025.01); *H10D 99/00* (2025.01); *H10D*
        *30/6735* (2025.01); *H10D 30/6755* (2025.01);
        *H10D 62/122* (2025.01); *H10D 64/205*
        (2025.01)

(56) References Cited

U.S. PATENT DOCUMENTS

| | | | |
|---|---|---|---|
| 9,780,170 | B2 | 10/2017 | Ota et al. |
| 2009/0189213 | A1 | 7/2009 | Matsuo et al. |
| 2013/0075733 | A1* | 3/2013 | Saito .................... H01L 21/465 |
| | | | 438/151 |

| | | | |
|---|---|---|---|
| 2013/0320848 | A1* | 12/2013 | Miyake .................. H05B 47/00 |
| | | | 315/53 |
| 2014/0008647 | A1* | 1/2014 | Yamazaki .............. H10D 99/00 |
| | | | 257/43 |
| 2018/0076231 | A1* | 3/2018 | Yamazaki ............ H10D 86/451 |
| 2021/0305431 | A1 | 9/2021 | Ishimaru et al. |
| 2021/0408293 | A1 | 12/2021 | Chiang et al. |
| 2022/0208248 | A1* | 6/2022 | Kunitake ............ G11C 29/844 |
| 2022/0310612 | A1 | 9/2022 | Okajima |
| 2023/0048781 | A1 | 2/2023 | Saito et al. |
| 2023/0088864 | A1* | 3/2023 | Kamiya ................. H10B 12/05 |
| | | | 257/43 |
| 2023/0309310 | A1 | 9/2023 | Saito et al. |
| 2024/0260253 | A1 | 8/2024 | Okajima et al. |

FOREIGN PATENT DOCUMENTS

| | | |
|---|---|---|
| JP | 2022147872 A | 10/2022 |
| JP | 2024106917 A | 8/2024 |
| TW | 202137417 A | 10/2021 |

* cited by examiner

AA' CROSS SECTION

SECOND DIRECTION

BB' CROSS SECTION

SECOND DIRECTION

THIRD DIRECTION

300

25

18

16

20 { 20b
20c
20a

25

16

CC' CROSS SECTION

SECOND DIRECTION

FIRST DIRECTION

FIG.18

DD' CROSS SECTION

SECOND DIRECTION

THIRD DIRECTION

500

18

20 { 20a
     20c
     20b

16

EE' CROSS SECTION

THIRD DIRECTION

FIRST DIRECTION

SEMICONDUCTOR DEVICE AND SEMICONDUCTOR MEMORY DEVICE

CROSS-REFERENCE TO RELATED APPLICATION

This application is based upon and claims the benefit of priority from Japanese Patent Application No. 2023-048944, filed on Mar. 24, 2023, the entire contents of which are incorporated herein by reference.

FIELD

Embodiments described herein relate generally to a semiconductor device and a semiconductor memory device.

BACKGROUND

An oxide semiconductor transistor in which a channel is formed in an oxide semiconductor layer has an excellent characteristic that the channel leakage current during off operation is very small. For this reason, for example, the oxide semiconductor transistor can be applied as a switching transistor of a memory cell in a dynamic random access memory (DRAM).

BRIEF DESCRIPTION OF THE DRAWINGS

FIG. 18 is a schematic cross-sectional view of the semiconductor device according to the fifth embodiment;

DETAILED DESCRIPTION

Figure 1:
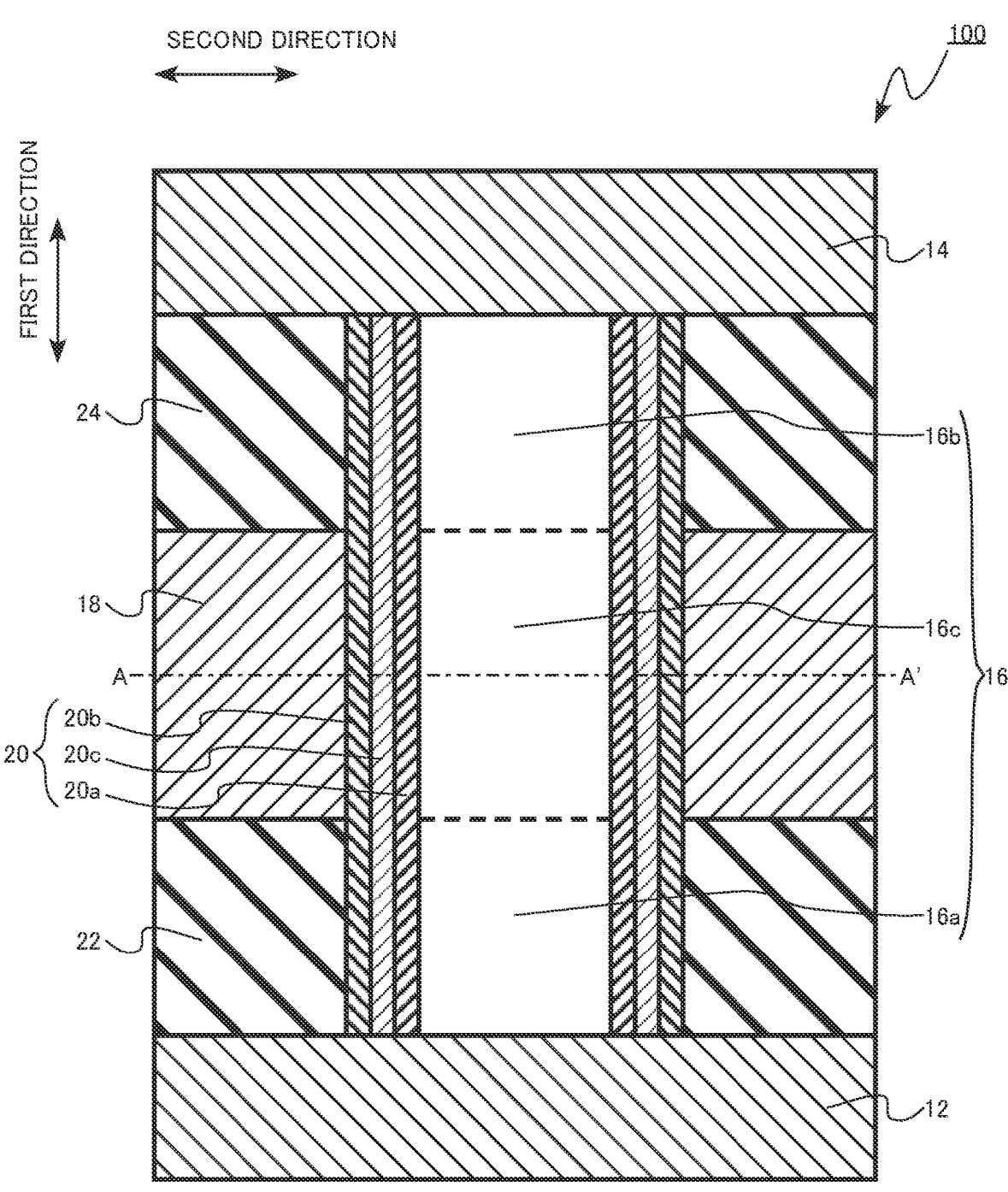
FIG. 1 is a schematic cross-sectional view of a semiconductor device according to a first embodiment.

A semiconductor device of embodiments includes: a first electrode; a second electrode; an oxide semiconductor layer provided between the first electrode and the second electrode and including a first region, a second region, and a third region disposed between the first region and the second region; a gate electrode facing the third region; a first insulating layer facing the first region; a second insulating layer facing the second region; and a gate insulating layer provided between the gate electrode and the oxide semiconductor layer, between the first insulating layer and the oxide semiconductor layer, and between the second insulating layer and the oxide semiconductor layer, containing oxygen (O) and at least one metal element selected from a group consisting of aluminum (Al), hafnium (Hf), zirconium (Zr), lanthanum (La), yttrium (Y), zinc (Zn), indium (In), tin (Sn), and gallium (Ga), and having a chemical composition different from a chemical composition of the oxide semiconductor layer.

Hereinafter, embodiments will be described with reference to the diagrams. In addition, in the following description, the same or similar members and the like are denoted by the same reference numerals, and the description of the members and the like once described may be omitted as appropriate.

In addition, in this specification, the term "upper" or "lower" may be used for convenience. "Upper" or "lower" is a term indicating the relative positional relationship in the diagram, but is not a term that defines the positional relationship with respect to gravity.

The qualitative analysis and quantitative analysis of the chemical composition of members forming the semiconductor device and the semiconductor memory device in this specification can be performed by, for example, secondary ion mass spectrometry (SIMS), energy dispersive X-ray spectroscopy (EDX), and Rutherford back-scattering spectroscopy (RBS) In addition, the materials of the members forming the semiconductor device and the semiconductor memory device can be checked by using, for example, X-ray Photoelectron Spectroscopy (XPS). In addition, when measuring the thickness of each member forming the semiconductor device and the semiconductor memory device, a distance between members, a crystal particle size, and the like, it is possible to use, for example, a transmission electron microscope (TEM). In addition, the electrical resistance of each member forming the semiconductor device and the semiconductor memory device in this specification can be measured by using, for example, scanning spreading resistance microscopy (SSRM).

First Embodiment

A semiconductor device according to a first embodiment includes: a first electrode; a second electrode; an oxide semiconductor layer provided between the first electrode and the second electrode and including a first region, a second region, and a third region disposed between the first region and the second region; a gate electrode facing the third region; a first insulating layer facing the first region; a second insulating layer facing the second region; and a gate insulating layer provided between the gate electrode and the oxide semiconductor layer, between the first insulating layer and the oxide semiconductor layer, and between the second insulating layer and the oxide semiconductor layer, containing oxygen (O) and at least one metal element selected from a group consisting of aluminum (Al), hafnium (Hf), zirconium (Zr), lanthanum (La), yttrium (Y), zinc (Zn), indium (In), tin (Sn), and gallium (Ga), and having a chemical composition different from that of the oxide semiconductor layer.

Figure 2:
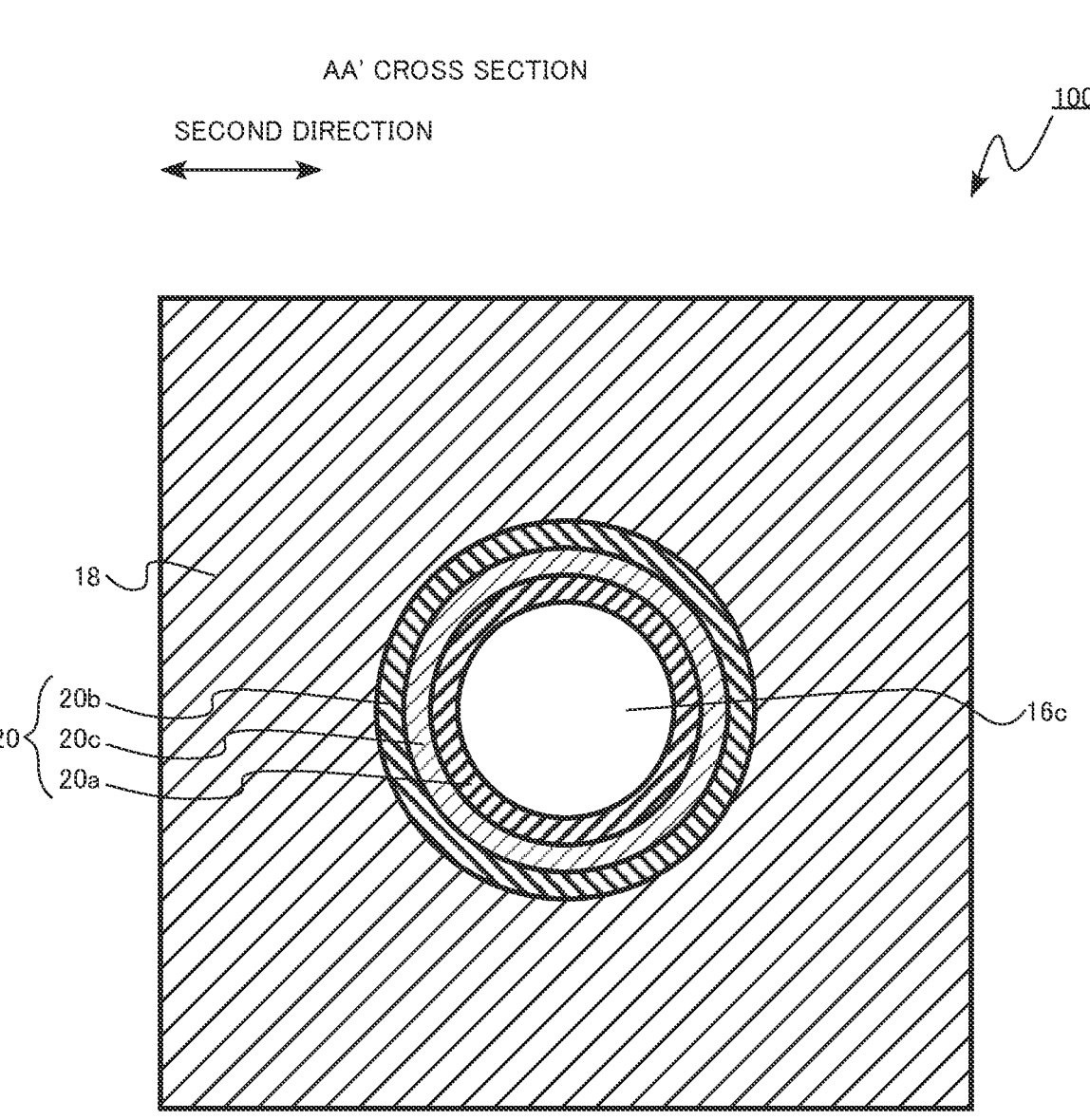
FIG. 2 is a schematic cross-sectional view of the semiconductor device according to the first embodiment.

FIGS. 1 and 2 are schematic cross-sectional views of the semiconductor device according to the first embodiment. FIG. 2 is a cross-sectional view taken along the line AA' of FIG. 1. In FIG. 1, the vertical direction is referred to as a first direction. In FIG. 1, the horizontal direction is referred to as a second direction. The second direction is perpendicular to the first direction.

The semiconductor device according to the first embodiment includes a transistor 100. The transistor 100 is an oxide semiconductor transistor in which a channel is formed in the oxide semiconductor. In the transistor 100, a gate electrode is provided so as to surround an oxide semiconductor layer in which a channel is formed. The transistor 100 is a so-called surrounding gate transistor (SGT). The transistor 100 is a so-called vertical transistor.

The transistor 100 includes a first electrode 12, a second electrode 14, an oxide semiconductor layer 16, a gate electrode 18, a gate insulating layer 20, a first insulating layer 22, and a second insulating layer 24. The oxide semiconductor layer 16 includes a first region 16a, a second region 16b, and a third region 16c. The gate insulating layer 20 includes a first portion 20a, a second portion 20b, and a third portion 20c.

The first electrode 12 functions as a source electrode or a drain electrode of the transistor 100.

The first electrode 12 is a conductor. The first electrode 12 contains, for example, an oxide conductor or a metal. The first electrode 12 is, for example, an oxide conductor containing indium (In), tin (Sn), and oxygen (O). The first electrode 12 is, for example, an indium tin oxide. The first electrode 12 is, for example, a metal containing tungsten (W), molybdenum (Mo), copper (Cu), aluminum (Al), titanium (Ti), nickel (Ni), platinum (Pt), or tantalum (Ta). The first electrode 12 is, for example, a titanium nitride or a nickel sulfide.

The first electrode 12 may have, for example, a stacked structure in which a plurality of conductors are stacked.

The second electrode 14 functions as a source electrode or a drain electrode of the transistor 100. The direction from the first electrode 12 toward the second electrode 14 is the first direction.

The second electrode 14 is a conductor. The second electrode 14 contains, for example, an oxide conductor or a metal. The second electrode 14 is, for example, an oxide conductor containing indium (In), tin (Sn), and oxygen (O). The second electrode 14 is, for example, an indium tin oxide. The second electrode 14 is, for example, a metal containing tungsten (W), molybdenum (Mo), copper (Cu), aluminum (Al), titanium (Ti), nickel (Ni), platinum (Pt), or tantalum (Ta). The second electrode 14 is, for example, a titanium nitride or a nickel sulfide.

The second electrode 14 may have, for example, a stacked structure in which a plurality of conductors are stacked.

The first electrode 12 and the second electrode 14 are formed of, for example, the same material. For example, the first electrode 12 and the second electrode 14 are oxide conductors containing indium (In), tin (Sn), and oxygen (O). Each of the first electrode 12 and the second electrode 14 is, for example, an indium tin oxide.

The oxide semiconductor layer 16 is provided between the first electrode 12 and the second electrode 14. The oxide semiconductor layer 16 is in contact with the first electrode 12. The oxide semiconductor layer 16 is in contact with the second electrode 14. The oxide semiconductor layer 16 is electrically connected to the first electrode 12 and the second electrode 14.

The length of the oxide semiconductor layer 16 in the first direction is, for example, equal to or more than 80 nm and equal to or less than 200 nm. The width of the oxide semiconductor layer 16 in the second direction is, for example, equal to or more than 20 nm and equal to or less than 50 nm.

The oxide semiconductor layer 16 is an oxide semiconductor. The oxide semiconductor layer 16 is, for example, amorphous.

The oxide semiconductor layer 16 contains, for example, zinc (Zn), oxygen (O), and at least one element selected from a group consisting of indium (In), gallium (Ga), silicon (Si), aluminum (Al), and tin (Sn). The oxide semiconductor layer 16 contains, for example, indium (In), gallium (Ga), and zinc (Zn). The oxide semiconductor layer 16 contains, for example, indium (In), aluminum (Al), and zinc (Zn).

The oxide semiconductor layer 16 contains, for example, at least one element selected from a group consisting of titanium (Ti), zinc (Zn), and tungsten (W). For example, the oxide semiconductor layer 16 contains titanium oxide, zinc oxide, or tungsten oxide.

The oxide semiconductor layer 16 has a chemical composition different from the chemical composition of the first electrode 12 and the chemical composition of the second electrode 14.

The oxide semiconductor layer 16 includes, for example, oxygen vacancies. Oxygen vacancies in the oxide semiconductor layer 16 function as donors for supplying electrons to the oxide semiconductor layer 16. As the density of oxygen vacancies in the oxide semiconductor layer 16 increases, the electrical resistance of the oxide semiconductor layer 16 decreases.

The oxide semiconductor layer 16 includes the first region 16a, the second region 16b, and the third region 16c. The third region 16c is provided between the first region 16a and the second region 16b.

The first region 16a is provided between the third region 16c and the first electrode 12. The first region 16a is in contact with, for example, the first electrode 12.

The second region 16b is provided between the third region 16c and the second electrode 14. The second region 16b is in contact with, for example, the second electrode 14.

The first region 16a and the second region 16b function as a source region or a drain region of the transistor 100. In the third region 16c, a channel serving as a current path is formed when the transistor 100 is turned on.

At least one of the first region 16a and the second region 16b includes a high resistance portion having an electrical resistance higher than that of the third region 16c. For example, the first region 16a includes a high resistance portion having an electrical resistance higher than that of the third region 16c. In addition, for example, the second region 16b includes a high resistance portion having an electrical resistance higher than that of the third region 16c.

The electrical resistance of the first region 16a, the second region 16b, or the third region 16c means an electrical resistance when no voltage is applied to the first electrode 12, the second electrode 14, and the gate electrode 18.

For example, the electrical resistance at any position in the first region 16a is higher than the electrical resistance at any position in the third region 16c. In addition, for example, the electrical resistance at any position in the second region 16b is higher than the electrical resistance at any position in the third region 16c.

For example, the entire first region 16a is an example of a high resistance portion. In addition, for example, the entire second region 16b is an example of a high resistance portion.

For example, a portion of the first region 16a in contact with the gate insulating layer 20 is the high resistance portion. For example, the electrical resistance of the portion of the first region 16a in contact with the gate insulating layer 20 is higher than the electrical resistance of a portion of the third region 16c in contact with the gate insulating layer 20.

For example, a portion of the second region 16b in contact with the gate insulating layer 20 is the high resistance portion. For example, the electrical resistance of the portion of the second region 16b in contact with the gate insulating layer 20 is higher than the electrical resistance of the portion of the third region 16c in contact with the gate insulating layer 20.

The electrical resistance of the high resistance portion is, for example, 1.1 to 2 times the electrical resistance of the third region 16c.

At least one of the first region 16a and the second region 16b includes a low oxygen vacancy density portion having an oxygen vacancy density lower than that of the third region 16c. For example, the first region 16a includes a low oxygen vacancy density portion having an oxygen vacancy density lower than that of the third region 16c. In addition, for example, the second region 16b includes a low oxygen vacancy density portion having an oxygen vacancy density lower than that of the third region 16c.

Oxygen vacancies in the oxide semiconductor function as donors. Therefore, the electrical resistance of the oxide semiconductor increases as the oxygen vacancy density decreases. The low oxygen vacancy density portions of the first region 16a and the second region 16b correspond to, for example, the high resistance portions of the first region 16a and the second region 16b.

For example, the oxygen vacancy density at any position in the first region 16a is lower than the oxygen vacancy density at any position in the third region 16c. In addition, for example, the oxygen vacancy density at any position in the second region 16b is lower than the oxygen vacancy density at any position in the third region 16c.

For example, a portion of the first region 16a in contact with the gate insulating layer 20 is the low oxygen vacancy density portion. For example, the oxygen vacancy density of the portion of the first region 16a in contact with the gate insulating layer 20 is lower than the oxygen vacancy density of a portion of the third region 16c in contact with the gate insulating layer 20.

For example, a portion of the second region 16b in contact with the gate insulating layer 20 is the low oxygen vacancy density portion. For example, the oxygen vacancy density of the portion of the second region 16b in contact with the gate insulating layer 20 is lower than the oxygen vacancy density of the portion of the third region 16c in contact with the gate insulating layer 20.

The gate electrode 18 faces the oxide semiconductor layer 16. The gate electrode 18 faces the third region 16c of the oxide semiconductor layer 16.

As shown in FIG. 2, the gate electrode 18 surrounds the oxide semiconductor layer 16. The gate electrode 18 is provided around the oxide semiconductor layer 16. The gate electrode 18 surrounds the third region 16c.

The gate electrode 18 is a conductor. The gate electrode 18 is, for example, a metal, a metal compound, or a semiconductor. The gate electrode 18 contains, for example, tungsten (W).

The length of the gate electrode 18 in the first direction is, for example, equal to or more than 20 nm and equal to or less than 100 nm.

The gate insulating layer 20 is provided between the gate electrode 18 and the oxide semiconductor layer 16. The gate insulating layer 20 is provided between the first insulating layer 22 and the oxide semiconductor layer 16. The gate insulating layer 20 is provided between the second insulating layer 24 and the oxide semiconductor layer 16.

The gate insulating layer 20 is provided so as to surround the oxide semiconductor layer 16. The gate insulating layer 20 surrounds the first region 16a, the second region 16b, and the third region 16c.

The gate insulating layer 20 is in contact with the oxide semiconductor layer 16. The gate insulating layer 20 is in contact with the first region 16a, the second region 16b, and the third region 16c.

The gate insulating layer 20 has a chemical composition different from that of the oxide semiconductor layer 16.

The gate insulating layer 20 contains oxygen (O) and at least one metal element selected from a group consisting of aluminum (Al), hafnium (Hf), zirconium (Zr), lanthanum (La), yttrium (Y), zinc (Zn), indium (In), tin (Sn), and gallium (Ga). The gate insulating layer 20 contains, for example, a metal oxide that is an oxide of the above-described at least one metal element.

The gate insulating layer 20 contains, for example, at least one metal oxide selected from a group consisting of aluminum oxide, hafnium oxide, zirconium oxide, lanthanum oxide, yttrium oxide, zinc oxide, indium oxide, tin oxide, and gallium oxide.

Hereinafter, a case where the above-described at least one metal element is aluminum (Al) will be described as an example.

The gate insulating layer 20 contains, for example, silicon (Si). The gate insulating layer 20 contains, for example, silicon oxide.

The gate insulating layer 20 contains, for example, silicon (Si) and nitrogen (N). The gate insulating layer 20 contains, for example, silicon nitride or silicon oxynitride.

For example, the atomic concentration of nitrogen in the gate insulating layer 20 provided between the first insulating layer 22 and the oxide semiconductor layer 16 is lower than the atomic concentration of nitrogen in the gate insulating layer 20 provided between the gate electrode 18 and the oxide semiconductor layer 16.

For example, the atomic concentration of nitrogen in the gate insulating layer 20 provided between the first insulating layer 22 and the oxide semiconductor layer 16 is 0.1 to 0.8 times the atomic concentration of nitrogen in the gate insulating layer 20 provided between the gate electrode 18 and the oxide semiconductor layer 16.

In addition, for example, the atomic concentration of nitrogen in the gate insulating layer 20 provided between the second insulating layer 24 and the oxide semiconductor layer 16 is lower than the atomic concentration of nitrogen in the gate insulating layer 20 provided between the gate electrode 18 and the oxide semiconductor layer 16.

In addition, for example, the atomic concentration of nitrogen in the gate insulating layer 20 provided between the second insulating layer 24 and the oxide semiconductor layer 16 is 0.1 to 0.8 times the atomic concentration of nitrogen in the gate insulating layer 20 provided between the gate electrode 18 and the oxide semiconductor layer 16.

The gate insulating layer 20 includes, for example, the first portion 20a, the second portion 20b, and the third portion 20c. The third portion 20c is provided between the first portion 20a and the second portion 20b. The first portion 20a is provided between the oxide semiconductor layer 16 and the second portion 20b.

The first portion 20a, the second portion 20b, and the third portion 20c form, for example, a three-layer structure. The first portion 20a, the second portion 20b, and the third portion 20c form, for example, a stacked structure.

The first portion 20a is in contact with, for example, the oxide semiconductor layer 16. The second portion 20b is in contact with, for example, the gate electrode 18.

The first portion 20a contains silicon (Si) and oxygen (O). The first portion 20a contains, for example, silicon oxide. The first portion 20a is, for example, a silicon oxide.

The second portion 20b contains silicon (Si) and nitrogen (N). The second portion 20b contains, for example, silicon nitride or silicon oxynitride. The second portion 20b is, for example, a silicon nitride or a silicon oxynitride.

The third portion 20c contains oxygen (O) and at least one metal element selected from a group consisting of aluminum (Al), hafnium (Hf), zirconium (Zr), lanthanum (La), yttrium (Y), zinc (Zn), indium (In), tin (Sn), and gallium (Ga). The gate insulating layer 20 contains, for example, a metal oxide that is an oxide of the above-described at least one metal element.

The third portion 20c contains, for example, at least one metal oxide selected from a group consisting of aluminum oxide, hafnium oxide, zirconium oxide, lanthanum oxide, yttrium oxide, zinc oxide, indium oxide, tin oxide, and gallium oxide. The third portion 20c is, for example, an aluminum oxide, a hafnium oxide, a zirconium oxide, a lanthanum oxide, an yttrium oxide, a zinc oxide, an indium oxide, a tin oxide, or a gallium oxide.

For example, the atomic concentration of the above-described at least one metal element in the third portion 20c is higher than the atomic concentration of the above-described at least one metal element in the first portion 20a and the second portion 20b. For example, when the above-described at least one metal element is aluminum (Al), the atomic concentration of aluminum (Al) in the third portion 20c is higher than the atomic concentration of aluminum (Al) in the first portion 20a and the second portion 20b.

For example, the atomic concentration of nitrogen (N) in the second portion 20b is higher than the atomic concentration of nitrogen (N) in the first portion 20a and the third portion 20c.

For example, the ratio of the atomic concentration of the above-described at least one metal element to the atomic concentration of nitrogen in the gate insulating layer 20 provided between the first insulating layer 22 and the oxide semiconductor layer 16 is higher than the ratio of the atomic concentration of the above-described at least one metal element to the atomic concentration of nitrogen in the gate insulating layer 20 provided between the gate electrode 18 and the oxide semiconductor layer 16. For example, when the above-described at least one metal element is aluminum (Al), the ratio (Al/N) of the atomic concentration of aluminum (Al) to the atomic concentration of nitrogen (N) in the gate insulating layer 20 provided between the first insulating layer 22 and the oxide semiconductor layer 16 is higher than the ratio (Al/N) of the atomic concentration of aluminum (Al) to the atomic concentration of nitrogen (N) in the gate insulating layer 20 provided between the gate electrode 18 and the oxide semiconductor layer 16.

For example, the ratio of the atomic concentration of the above-described at least one metal element to the atomic concentration of nitrogen in the gate insulating layer 20 provided between the first insulating layer 22 and the oxide semiconductor layer 16 is 1.2 to 10 times the ratio of the atomic concentration of the above-described at least one metal element to the atomic concentration of nitrogen in the gate insulating layer 20 provided between the gate electrode 18 and the oxide semiconductor layer 16.

For example, the ratio of the atomic concentration of the above-described at least one metal element to the atomic concentration of nitrogen in the gate insulating layer 20 provided between the second insulating layer 24 and the oxide semiconductor layer 16 is higher than the ratio of the atomic concentration of the above-described at least one metal element to the atomic concentration of nitrogen in the gate insulating layer 20 provided between the gate electrode 18 and the oxide semiconductor layer 16. For example, when the above-described at least one metal element is aluminum (Al), the ratio (Al/N) of the atomic concentration of aluminum (Al) to the atomic concentration of nitrogen (N) in the gate insulating layer 20 provided between the second insulating layer 24 and the oxide semiconductor layer 16 is higher than the ratio (Al/N) of the atomic concentration of aluminum (Al) to the atomic concentration of nitrogen (N) in the gate insulating layer 20 provided between the gate electrode 18 and the oxide semiconductor layer 16.

For example, the ratio of the atomic concentration of the above-described at least one metal element to the atomic concentration of nitrogen in the gate insulating layer 20 provided between the second insulating layer 24 and the oxide semiconductor layer 16 is 1.2 to 10 times the ratio of the atomic concentration of the above-described at least one metal element to the atomic concentration of nitrogen in the gate insulating layer 20 provided between the gate electrode 18 and the oxide semiconductor layer 16.

The gate insulating layer 20 contains, for example, at least one element selected from a group consisting of nitrogen (N), carbon (C), hydrogen (H), and chlorine (Cl).

The thickness of the gate insulating layer 20 in a direction from the oxide semiconductor layer 16 toward the gate electrode 18 is, for example, equal to or more than 2 nm and equal to or less than 10 nm. For example, the thickness of the gate insulating layer 20 in the second direction is equal to or more than 2 nm and equal to or less than 10 nm.

The thickness of the third portion 20c in a direction from the oxide semiconductor layer 16 toward the gate electrode 18 is, for example, equal to or more than 0.5 nm and equal to or less than 3 nm. For example, the thickness of the third portion 20c in the second direction is equal to or more than 0.5 nm and equal to or less than 3 nm.

The first insulating layer 22 is provided between the first electrode 12 and the gate electrode 18. The first insulating layer 22 faces the oxide semiconductor layer 16. The first insulating layer 22 faces the first region 16a.

The first insulating layer 22 surrounds the oxide semiconductor layer 16. The first insulating layer 22 surrounds the first region 16a.

The gate insulating layer 20 is provided between the first insulating layer 22 and the oxide semiconductor layer 16. The gate insulating layer 20 is provided between the first insulating layer 22 and the first region 16a. The first insulating layer 22 is in contact with, for example, the gate insulating layer 20.

The first insulating layer 22 surrounds, for example, the gate insulating layer 20.

The first insulating layer 22 contains, for example, oxygen (O). The first insulating layer 22 contains, for example, oxide.

The first insulating layer 22 contains, for example, silicon (Si) and oxygen (O). The first insulating layer 22 contains, for example, silicon oxide. The first insulating layer 22 is, for example, a silicon oxide.

The second insulating layer 24 is provided between the second electrode 14 and the gate electrode 18. The second insulating layer 24 faces the oxide semiconductor layer 16. The second insulating layer 24 faces the second region 16b.

The second insulating layer 24 surrounds the oxide semiconductor layer 16. The second insulating layer 24 surrounds the second region 16b.

The gate insulating layer 20 is provided between the second insulating layer 24 and the oxide semiconductor layer 16. The gate insulating layer 20 is provided between the second insulating layer 24 and the second region 16b. The second insulating layer 24 is in contact with, for example, the gate insulating layer 20.

The second insulating layer 24 surrounds, for example, the gate insulating layer 20.

The second insulating layer 24 contains, for example, oxygen (O). The second insulating layer 24 contains, for example, oxide.

The second insulating layer 24 contains, for example, silicon (Si) and oxygen (O). The second insulating layer 24 contains, for example, silicon oxide. The second insulating layer 24 is, for example, a silicon oxide.

Next, an example of a method for manufacturing the semiconductor device according to the first embodiment will be described.

FIGS. 3 to 7 are schematic cross-sectional views showing an example of a method for manufacturing the semiconductor device according to the first embodiment. FIGS. 3 to 7 each shows a cross section corresponding to FIG. 1. FIGS. 3 to 7 are diagrams showing an example of a method for manufacturing the transistor 100.

First, a first indium tin oxide film 31, a first silicon oxide film 32, a tungsten layer 33, and a second silicon oxide film 34 are stacked on a substrate (not shown) in this order in the first direction. The first indium tin oxide film 31, the first silicon oxide film 32, the tungsten layer 33, and the second silicon oxide film 34 are formed by using, for example, a chemical vapor deposition method (CVD method).

The first indium tin oxide film 31 finally becomes the first electrode 12. A part of the first silicon oxide film 32 finally becomes the first insulating layer 22. A part of the tungsten layer 33 finally becomes the gate electrode 18. A part of the second silicon oxide film 34 finally becomes the second insulating layer 24.

Figure 3:
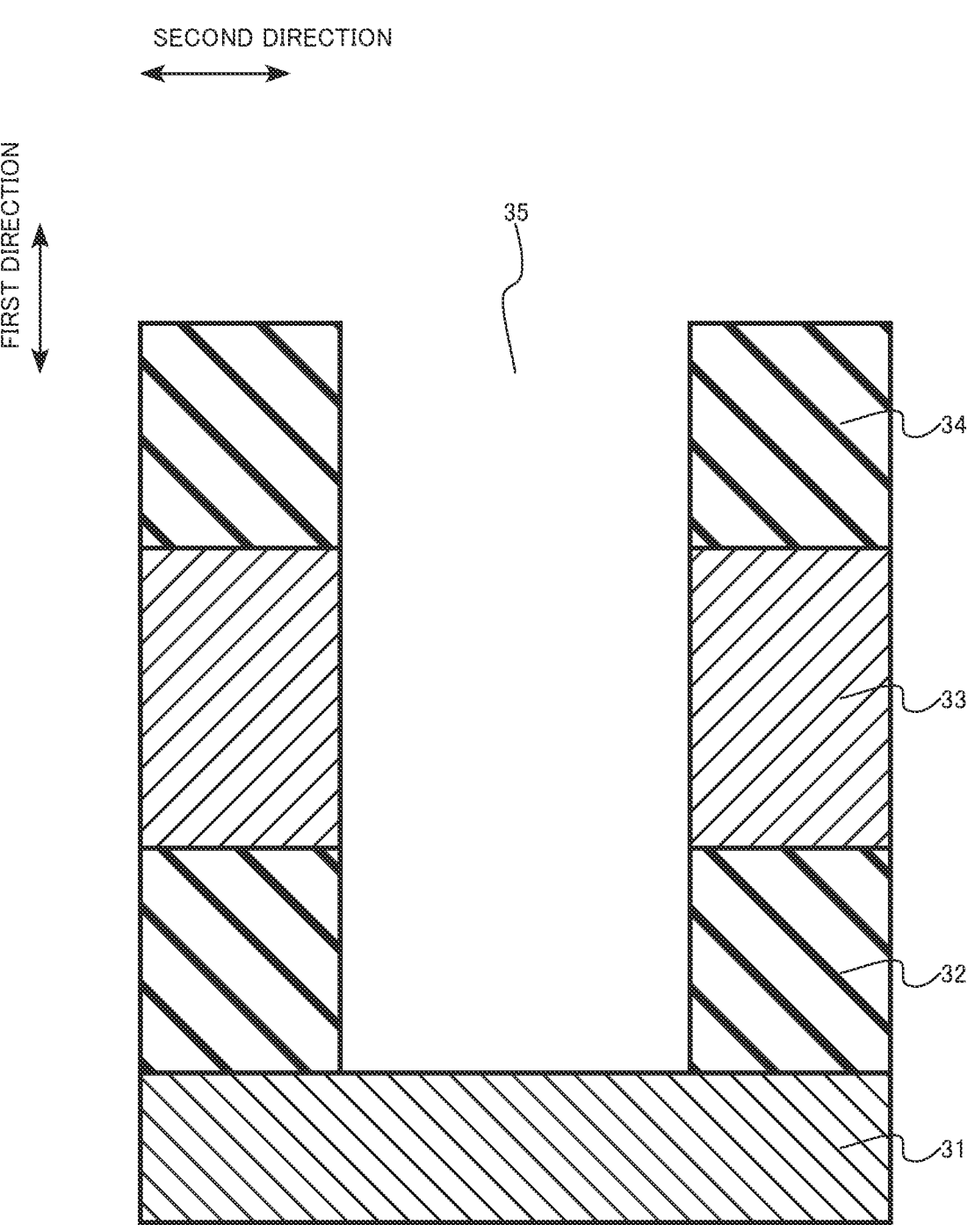
FIG. 3 is a schematic cross-sectional view showing an example of a method for manufacturing the semiconductor device according to the first embodiment.

Then, from the surface of the second silicon oxide film 34, an opening 35 is formed so as to pass through the second silicon oxide film 34, the tungsten layer 33, and the first silicon oxide film 32 (FIG. 3). The opening 35 is formed by using, for example, a lithography method and a reactive ion etching method (RIE method).

Figure 4:
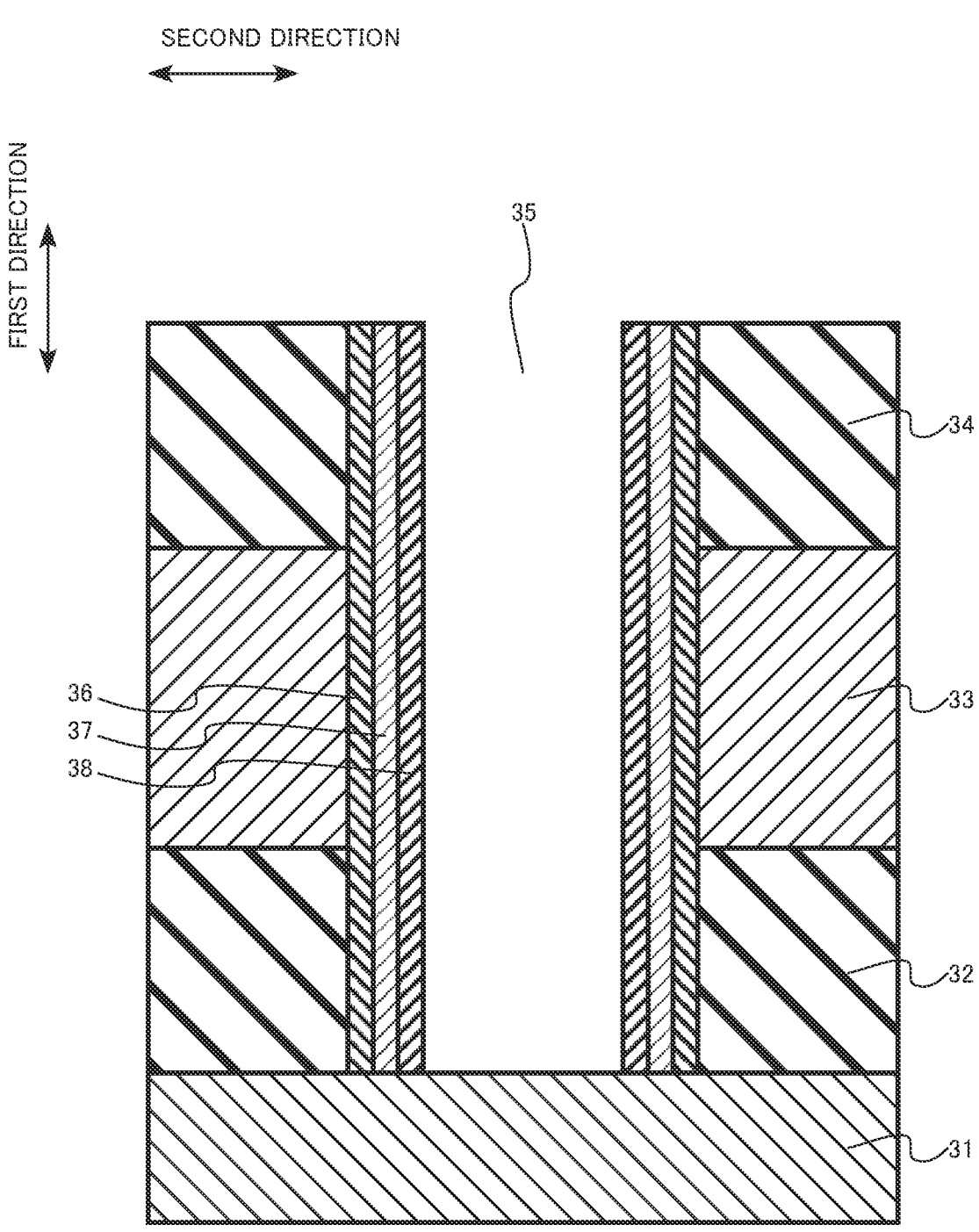
FIG. 4 is a schematic cross-sectional view showing an example of the method for manufacturing the semiconductor device according to the first embodiment.

Then, a silicon nitride film 36, an aluminum oxide film 37, and a silicon oxide film 38 are formed in this order inside the opening 35 (FIG. 4). The silicon nitride film 36, the aluminum oxide film 37, and the silicon oxide film 38 are formed by using, for example, a CVD method and an RIE method.

The silicon nitride film 36 finally becomes the second portion 20b of the gate insulating layer 20. The aluminum oxide film 37 finally becomes the third portion 20c of the gate insulating layer 20. The silicon oxide film 38 finally becomes the first portion 20a of the gate insulating layer 20.

Figure 5:
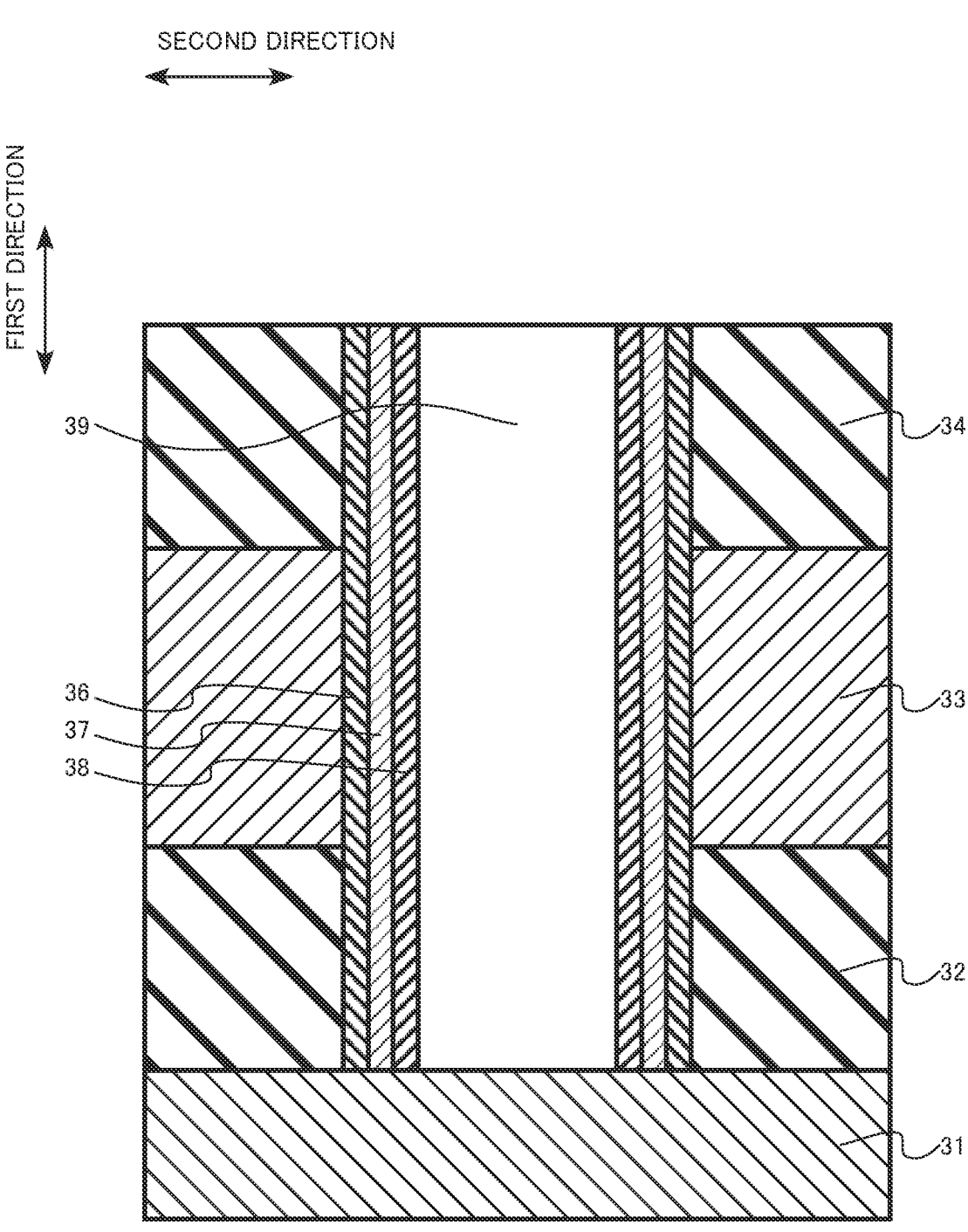
FIG. 5 is a schematic cross-sectional view showing an example of the method for manufacturing the semiconductor device of the first embodiment.

Then, the opening 35 is buried with an oxide semiconductor film 39 (FIG. 5). The oxide semiconductor film 39 finally becomes the oxide semiconductor layer 16.

The oxide semiconductor film 39 contains, for example, indium (In), gallium (Ga), and zinc (Zn). The oxide semiconductor film 39 is formed by using, for example, a CVD method. Thereafter, the oxide semiconductor film 39 on the second silicon oxide film 34 is removed by using, for example, a chemical mechanical polishing method (CMP method).

Figure 6:
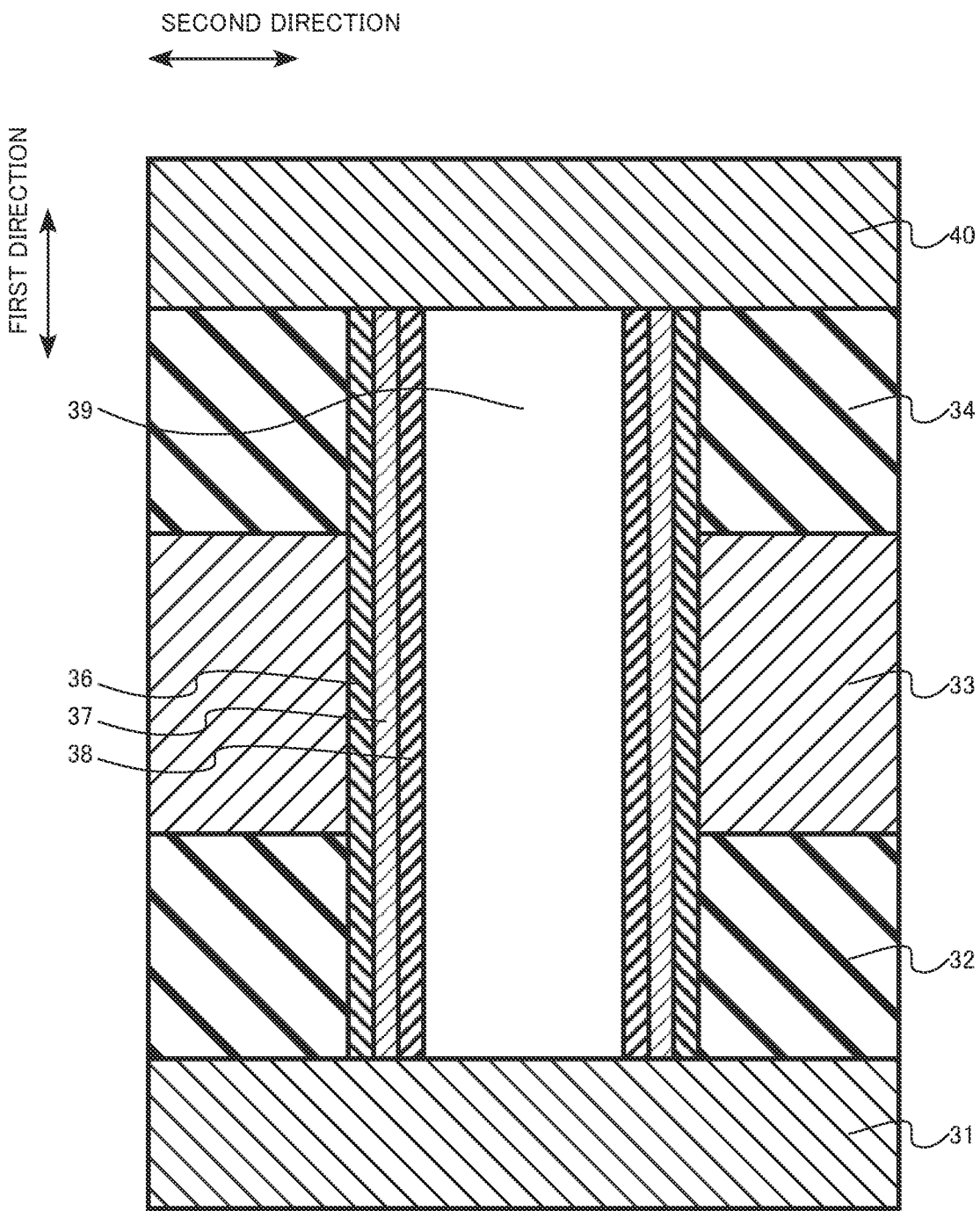
FIG. 6 is a schematic cross-sectional view showing an example of the method for manufacturing the semiconductor device according to the first embodiment.

Then, a second indium tin oxide film 40 is formed (FIG. 6). The second indium tin oxide film 40 is formed by using, for example, a CVD method. The second indium tin oxide film 40 finally becomes the second electrode 14.

Figure 7:
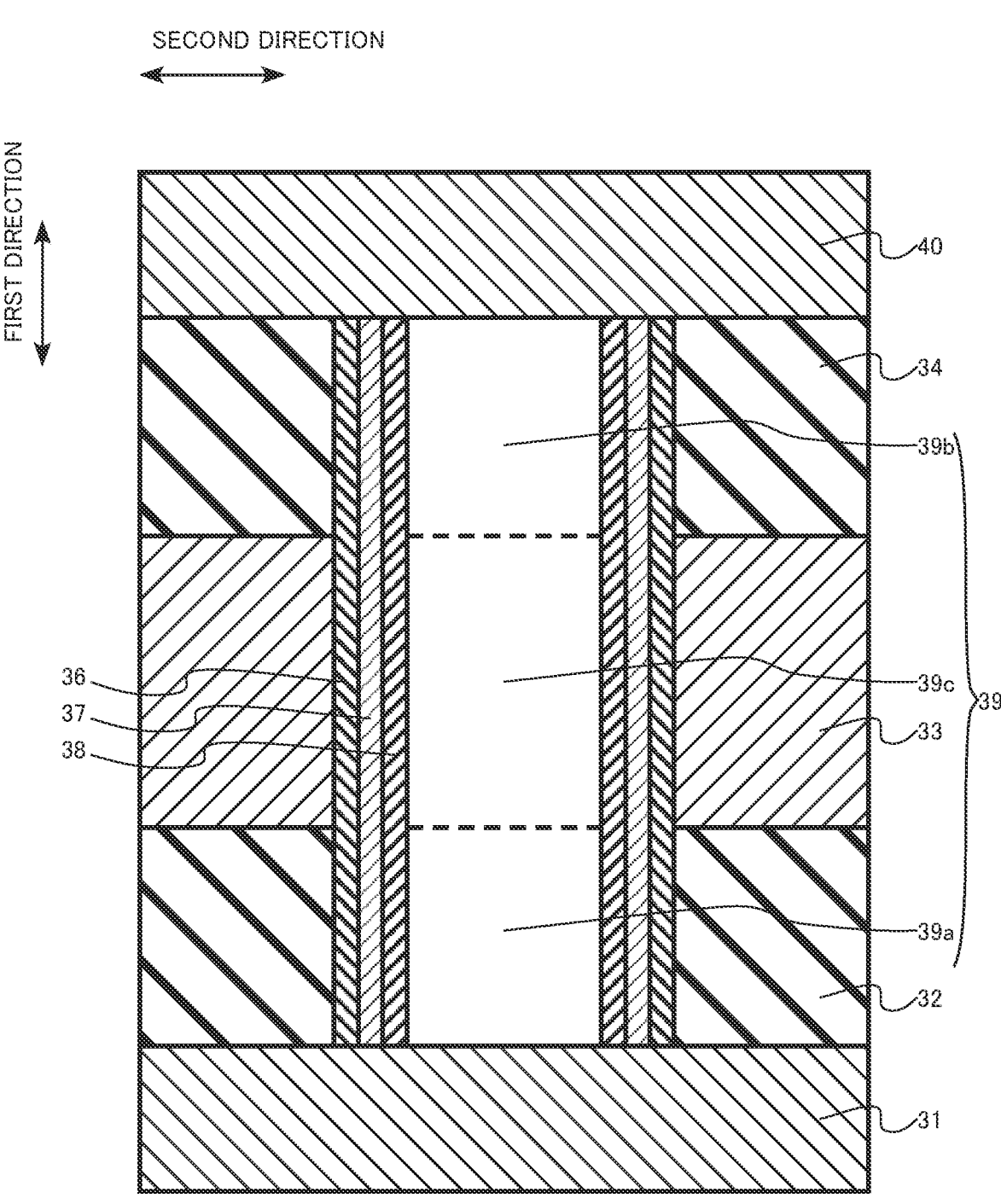
FIG. 7 is a schematic cross-sectional view showing an example of the method for manufacturing the semiconductor device according to the first embodiment.

Then, heat treatment is performed in an oxidizing atmosphere (FIG. 7). By the heat treatment, a first low oxygen vacancy density region 39a, a second low oxygen vacancy density region 39b, and a high oxygen vacancy density region 39c are formed.

During the heat treatment in the oxidizing atmosphere, oxygen is supplied to the oxide semiconductor film 39 through the first silicon oxide film 32 and the second silicon oxide film 34. By supplying oxygen to the oxide semiconductor film 39, the first low oxygen vacancy density region 39a and the second low oxygen vacancy density region 39b having a low oxygen vacancy density are formed.

The first low oxygen vacancy density region 39a finally becomes the first region 16a. The second low oxygen vacancy density region 39b finally becomes the second region 16b. The high oxygen vacancy density region 39c finally becomes the third region 16c.

By the manufacturing method described above, the transistor 100 shown in FIGS. 1 and 2 is manufactured.

Next, the function and effect of the semiconductor device according to the first embodiment will be described.

An oxide semiconductor transistor in which a channel is formed in an oxide semiconductor layer has an excellent characteristic that the channel leakage current during off operation is very small. For this reason, for example, the oxide semiconductor transistor can be applied as a switching transistor of a memory cell in a DRAM. By applying the oxide semiconductor transistor as a switching transistor, the charge storage characteristic of the DRAM is improved.

For example, in order to improve the write/read speed of a DRAM, it is desired to increase the on-current of the switching transistor. There is a trade-off relationship between the threshold voltage and the on-current of the oxide semiconductor transistor. In other words, the on-current decreases as the threshold voltage of the oxide semiconductor transistor increases, and the on-current increases as the threshold voltage decreases.

The gate insulating layer 20 of the transistor 100 according to the first embodiment contains oxygen (O) and at least one metal element selected from a group consisting of aluminum (Al), hafnium (Hf), zirconium (Zr), lanthanum (La), yttrium (Y), zinc (Zn), indium (In), tin (Sn), and gallium (Ga).

In the transistor 100 according to the first embodiment, since the gate insulating layer 20 contains the above-described at least one metal element and oxygen (O), the trade-off between the threshold voltage and the on-current is improved. Therefore, it is possible to increase the on-current at a desired threshold voltage.

It is thought that the reason why the trade-off between the threshold voltage and the on-current is improved by the gate insulating layer 20 containing the above-described at least one metal element and oxygen (O) is that a fixed charge or dipole is formed in the gate insulating layer 20 to increase the threshold voltage of the transistor 100.

In addition, it is thought that the reason why the trade-off between the threshold voltage and the on-current is improved by the gate insulating layer 20 containing the above-described at least one metal element and oxygen (O) is that the first region 16a or the second region 16b has a structure including a high resistance portion having an electrical resistance higher than that of the third region 16c.

The inventors' studies have revealed that a channel is difficult to form locally in a portion of the drain electrode side region of the oxide semiconductor layer 16 near the edge of the gate electrode 18 due to the influence of the drain voltage. Therefore, the threshold voltage of the transistor 100 can be increased by providing a high resistance portion having a low oxygen vacancy density and a high electrical resistance in the drain electrode side region of the oxide semiconductor layer 16. It is thought that the trade-off between the threshold voltage and the on-current is improved by providing a high resistance portion in the drain electrode side region of the oxide semiconductor layer 16 to increase the threshold voltage of the transistor 100.

For example, when the first electrode 12 functions as a source electrode to which a source voltage is applied and the second electrode 14 functions as a drain electrode to which a drain voltage is applied, the threshold voltage of the transistor 100 is increased by providing a high resistance portion in the second region 16b. In addition, for example, when the second electrode 14 functions as a source electrode and the first electrode 12 functions as a drain electrode to which a drain voltage is applied, the threshold voltage of the transistor 100 can be increased by providing a high resistance portion in the first region 16a.

The reason why a structure including a high resistance portion with a high electrical resistance is formed in the first region 16a or the second region 16b due to the gate insulating layer 20 containing the above-described at least one metal element and oxygen (O) can be considered as follows. When a film containing the above-described at least one metal element and oxygen (O) is formed on a semiconductor substrate and heat-treated in an oxidizing atmosphere, accelerated oxidation of the semiconductor substrate occurs. In other words, the supply of oxygen (O) to the semiconductor substrate is promoted by providing a film containing the above-described at least one metal element and oxygen (O).

Figure 8:
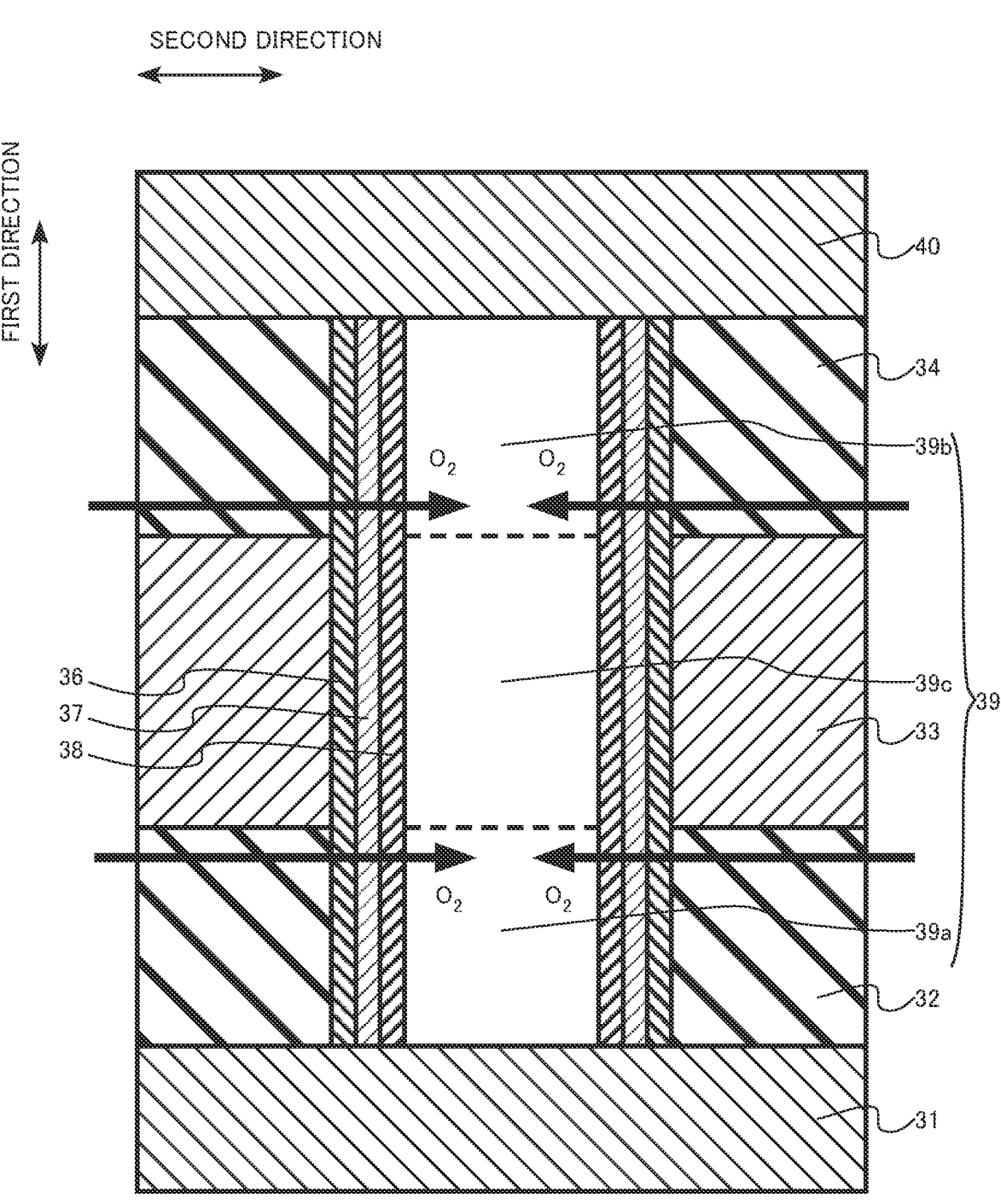
FIG. 8 is an explanatory diagram of the function and effect of the semiconductor device according to the first embodiment.

FIG. 8 is an explanatory diagram of the function and effect of the semiconductor device according to the first embodiment. FIG. 8 is a cross-sectional view corresponding to FIGS. 1 and 7. As shown in FIG. 8, during the heat treatment in the oxidizing atmosphere after forming the second indium tin oxide film 40, the provision of the aluminum oxide film 37 promotes the supply of oxygen (O) to the oxide semiconductor film 39. In addition, the supply of oxygen (O) to a region of the oxide semiconductor film 39 facing the tungsten layer 33 is suppressed by the tungsten layer 33.

Therefore, as shown in FIGS. 7 and 8, the first low oxygen vacancy density region 39a, the second low oxygen vacancy density region 39b, and the high oxygen vacancy density region 39c are formed in the oxide semiconductor film 39. The oxygen vacancy density of each of the first low oxygen vacancy density region 39a and the second low oxygen vacancy density region 39b is lower than the oxygen vacancy density of the high oxygen vacancy density region 39c. Therefore, the electrical resistance of each of the first low oxygen vacancy density region 39a and the second low oxygen vacancy density region 39b is higher than the electrical resistance of the high oxygen vacancy density region 39c. Thus, since the gate insulating layer 20 contains the above-described at least one metal element and oxygen (O), the transistor 100 has a structure including a high resistance portion with a high electrical resistance in the first region 16a or the second region 16b.

It is preferable that the thickness of the third portion 20c of the gate insulating layer 20 in a direction from the oxide semiconductor layer 16 toward the gate electrode 18 is, for example, equal to or more than 0.5 nm and equal to or less than 3 nm. When the thickness of the third portion 20c is equal to or more than 0.5 nm and equal to or less than 3 nm, the supply of oxygen (O) to the oxide semiconductor film 39 is promoted. As a result, it becomes easy to form a high resistance portion having a high electrical resistance in the first region 16a or the second region 16b.

The gate insulating layer 20 of the transistor 100 according to the first embodiment preferably includes the first portion 20a containing silicon (Si) and oxygen (O). By providing the first portion 20a, for example, the trap level in the gate insulating layer 20 can be reduced. Therefore, for example, the gate leakage current of the transistor 100 can be reduced.

In addition, for example, by providing the first portion 20a, the interface state at the interface between the gate insulating layer 20 and the oxide semiconductor layer 16 can be reduced. Therefore, for example, the mobility of carriers is improved and the on-current of the transistor 100 is increased.

The gate insulating layer 20 of the transistor 100 according to the first embodiment preferably includes the second portion 20b containing silicon (Si) and nitrogen (N). By providing the second portion 20b, for example, the metal contained in the gate electrode 18 diffuses into the gate insulating layer 20. As a result, it is possible to suppress an increase in leakage current of the gate insulating layer 20 or a decrease in reliability of the gate insulating layer 20.

It is preferable that the atomic concentration of nitrogen in the gate insulating layer 20 provided between the first insulating layer 22 and the oxide semiconductor layer 16 is lower than the atomic concentration of nitrogen in the gate insulating layer 20 provided between the gate electrode 18 and the oxide semiconductor layer 16. Since the atomic concentration of nitrogen in the gate insulating layer 20 provided between the gate electrode 18 and the oxide semiconductor layer 16 is high, it is possible to suppress the diffusion of the metal contained in the gate electrode 18 into the gate insulating layer 20. In addition, since the atomic concentration of nitrogen in the gate insulating layer 20 provided between the first insulating layer 22 and the oxide semiconductor layer 16 is low, the supply of oxygen (O) to the oxide semiconductor film 39 is promoted. As a result, it becomes easy to form a high resistance portion having a high electrical resistance in the first region 16a.

It is preferable that the atomic concentration of nitrogen in the gate insulating layer 20 provided between the second insulating layer 24 and the oxide semiconductor layer 16 is lower than the atomic concentration of nitrogen in the gate insulating layer 20 provided between the gate electrode 18 and the oxide semiconductor layer 16. Since the atomic concentration of nitrogen in the gate insulating layer 20 provided between the gate electrode 18 and the oxide semiconductor layer 16 is high, it is possible to suppress the diffusion of the metal contained in the gate electrode 18 into the gate insulating layer 20. In addition, since the atomic concentration of nitrogen in the gate insulating layer 20 provided between the second insulating layer 24 and the oxide semiconductor layer 16 is low, the supply of oxygen (O) to the oxide semiconductor film 39 is promoted. As a result, it becomes easy to form a high resistance portion having a high electrical resistance in the second region 16b.

It is preferable that the ratio of the atomic concentration of the above-described at least one metal element to the atomic concentration of nitrogen in the gate insulating layer 20 provided between the first insulating layer 22 and the oxide semiconductor layer 16 is higher than the ratio of the atomic concentration of the above-described at least one metal element to the atomic concentration of nitrogen in the gate insulating layer 20 provided between the gate electrode 18 and the oxide semiconductor layer 16. Since the ratio of the atomic concentration of the above-described at least one metal element to the atomic concentration of nitrogen in the gate insulating layer 20 provided between the first insulating layer 22 and the oxide semiconductor layer 16 is high, the supply of oxygen (O) to the oxide semiconductor film 39 is promoted. As a result, it becomes easy to form a high resistance portion having a high electrical resistance in the first region 16a.

It is preferable that the ratio of the atomic concentration of the above-described at least one metal element to the atomic concentration of nitrogen in the gate insulating layer 20 provided between the second insulating layer 24 and the oxide semiconductor layer 16 is higher than the ratio of the atomic concentration of the above-described at least one metal element to the atomic concentration of nitrogen in the gate insulating layer 20 provided between the gate electrode 18 and the oxide semiconductor layer 16. Since the ratio of the atomic concentration of the above-described at least one metal element to the atomic concentration of nitrogen in the gate insulating layer 20 provided between the second insulating layer 24 and the oxide semiconductor layer 16 is high, the supply of oxygen (O) to the oxide semiconductor film 39 is promoted. As a result, it becomes easy to form a high resistance portion having a high electrical resistance in the second region 16b.

In addition, the atomic concentration of nitrogen in the gate insulating layer 20 or the ratio of the atomic concentration of the above-described at least one metal element to the atomic concentration of nitrogen can be controlled, for example, by controlling the film forming conditions when forming a film containing silicon (Si) and nitrogen (N) inside the opening 35. For example, when the film containing silicon (Si) and nitrogen (N) is the silicon nitride film 36, the atomic concentration of nitrogen in the gate insulating layer 20 or the ratio of the atomic concentration of the above-described at least one metal element to the atomic concentration of nitrogen can be changed by forming the silicon nitride film 36 under the conditions in which the film thickness on the tungsten layer 33 is different from the film thickness on the first silicon oxide film 32 and the second silicon oxide film 34. A change in the film thickness of the silicon nitride film 36 depending on the base layer can be realized, for example, by applying conditions in which the incubation time during film formation differs depending on the base layer.

The gate insulating layer 20 preferably contains at least one element selected from a group consisting of nitrogen (N), carbon (C), hydrogen (H), and chlorine (Cl).

When the gate insulating layer 20 contains nitrogen (N) or carbon (C), for example, the diffusion of the metal contained in the gate electrode 18 into the gate insulating layer 20 is suppressed. As a result, it is possible to reduce the leakage current of the gate insulating layer 20 or improve the reliability of the gate insulating layer 20.

When the gate insulating layer 20 contains hydrogen (H) or chlorine (Cl), for example, the trap level in the gate insulating layer 20 is reduced. As a result, it is possible to reduce the leakage current of the gate insulating layer 20 or improve the reliability of the gate insulating layer 20.

Although the case where the above-described at least one metal element contained in the gate insulating layer 20 is aluminum (Al) has been mainly described, the same function and effect as in the case of aluminum (Al) can be realized even if the above-described at least one metal element is other than aluminum (Al).

In addition, although the case of the SGT in which the gate electrode 18 surrounds the third region 16c has been described as an example, it is also possible to adopt a structure in which a part of the third region 16c and the gate electrode 18 face each other.

In addition, although the case where the gate insulating layer 20 has a three-layer structure including the first portion 20a, the second portion 20b, and the third portion 20c has been described as an example, the gate insulating layer 20 is not limited to the three-layer structure described above. For example, the gate insulating layer 20 may have a single-layer structure, a two-layer structure, or a four-layer or more structure.

According to the transistor 100 according to the first embodiment, it is possible to increase the on-current at a desired threshold voltage.

First Modification Example

Figure 9:
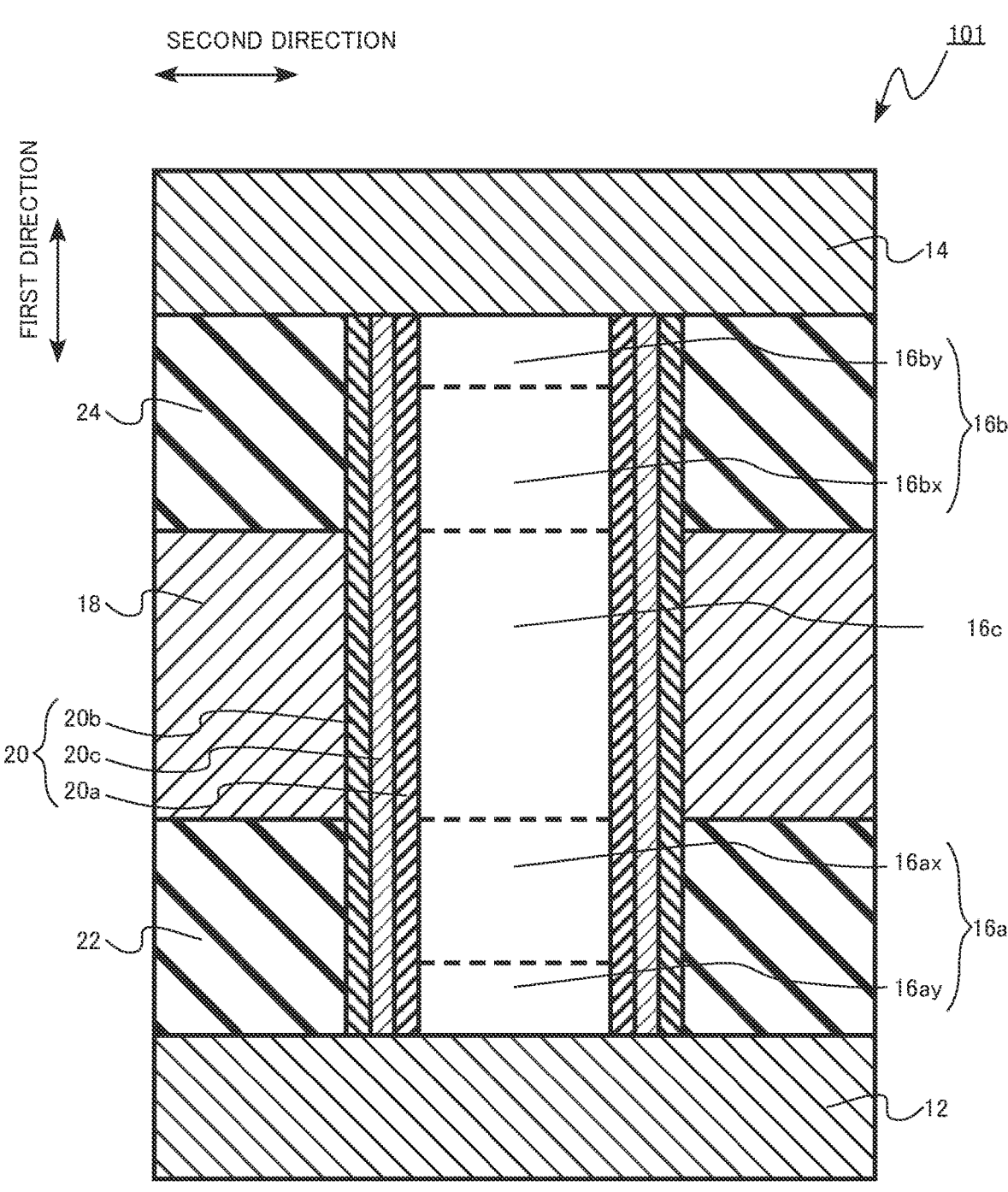
FIG. 9 is a schematic cross-sectional view of a semiconductor device according to a first modification example of the first embodiment.

FIG. 9 is a schematic cross-sectional view of a semiconductor device according to a first modification example of the first embodiment. The semiconductor device according to the first modification example of the first embodiment is different from the semiconductor device according to the first embodiment in that the first region includes a low resistance portion provided between the high resistance portion and the first electrode or the second region includes a low resistance portion provided between the high resistance portion and the second electrode and the electrical resistance of the low resistance portion is lower than the electrical resistance of the third region.

The semiconductor device according to the first modification example of the first embodiment includes a transistor 101.

The oxide semiconductor layer 16 includes a first region 16a, a second region 16b, and a third region 16c. The third region 16c is provided between the first region 16a and the second region 16b.

For example, the first region 16a includes a high resistance portion 16ax and a low resistance portion 16ay. The low resistance portion 16ay is provided between the high resistance portion 16ax and the first electrode 12.

The electrical resistance of the high resistance portion 16ax is higher than the electrical resistance of the low resistance portion 16ay. The electrical resistance of the high resistance portion 16ax is higher than the electrical resistance of the third region 16c. In addition, the electrical resistance of the low resistance portion 16ay is lower than the electrical resistance of the third region 16c.

The electrical resistance of the high resistance portion 16ax is, for example, 1.1 to 2 times the electrical resistance of the third region 16c. In addition, the electrical resistance of the low resistance portion 16ay is, for example, 0.5 to 0.9 times the electrical resistance of the third region 16c.

In addition, for example, the second region 16b includes a high resistance portion 16bx and a low resistance portion 16by. The low resistance portion 16by is provided between the high resistance portion 16bx and the first electrode 12.

The electrical resistance of the high resistance portion 16bx is higher than the electrical resistance of the low resistance portion 16by. The electrical resistance of the high resistance portion 16bx is higher than the electrical resistance of the third region 16c. In addition, the electrical resistance of the low resistance portion 16by is lower than the electrical resistance of the third region 16c.

The electrical resistance of the high resistance portion 16bx is, for example, 1.1 to 2 times the electrical resistance of the third region 16c. In addition, the electrical resistance of the low resistance portion 16by is, for example, 0.5 to 0.9 times the electrical resistance of the third region 16c.

The semiconductor device according to the first modification example of the first embodiment can be realized, for example, by applying a material that easily extracts oxygen from the oxide semiconductor layer 16 to the first electrode 12 or the second electrode 14. By extracting oxygen from the oxide semiconductor layer 16, the density of oxygen vacancies in a portion in contact with the first electrode 12 or the second electrode 14 can be increased. Therefore, it is possible to form the low resistance portion 16ay or the low resistance portion 16by.

According to the transistor 101 of the first modification example, the parasitic resistance of the transistor 101 is reduced by providing the low resistance portion 16ay or the low resistance portion 16by. Therefore, it is possible to further increase the on-current at a desired threshold voltage.

In the transistor 101 of the first modification example, the electrical resistance of the low resistance portion 16ay may be higher than the electrical resistance of the third region 16c. And, in the transistor 101 of the first modification example, the electrical resistance of the low resistance portion 16by may be higher than the electrical resistance of the third region 16c.

Second Modification Example

Figure 10:
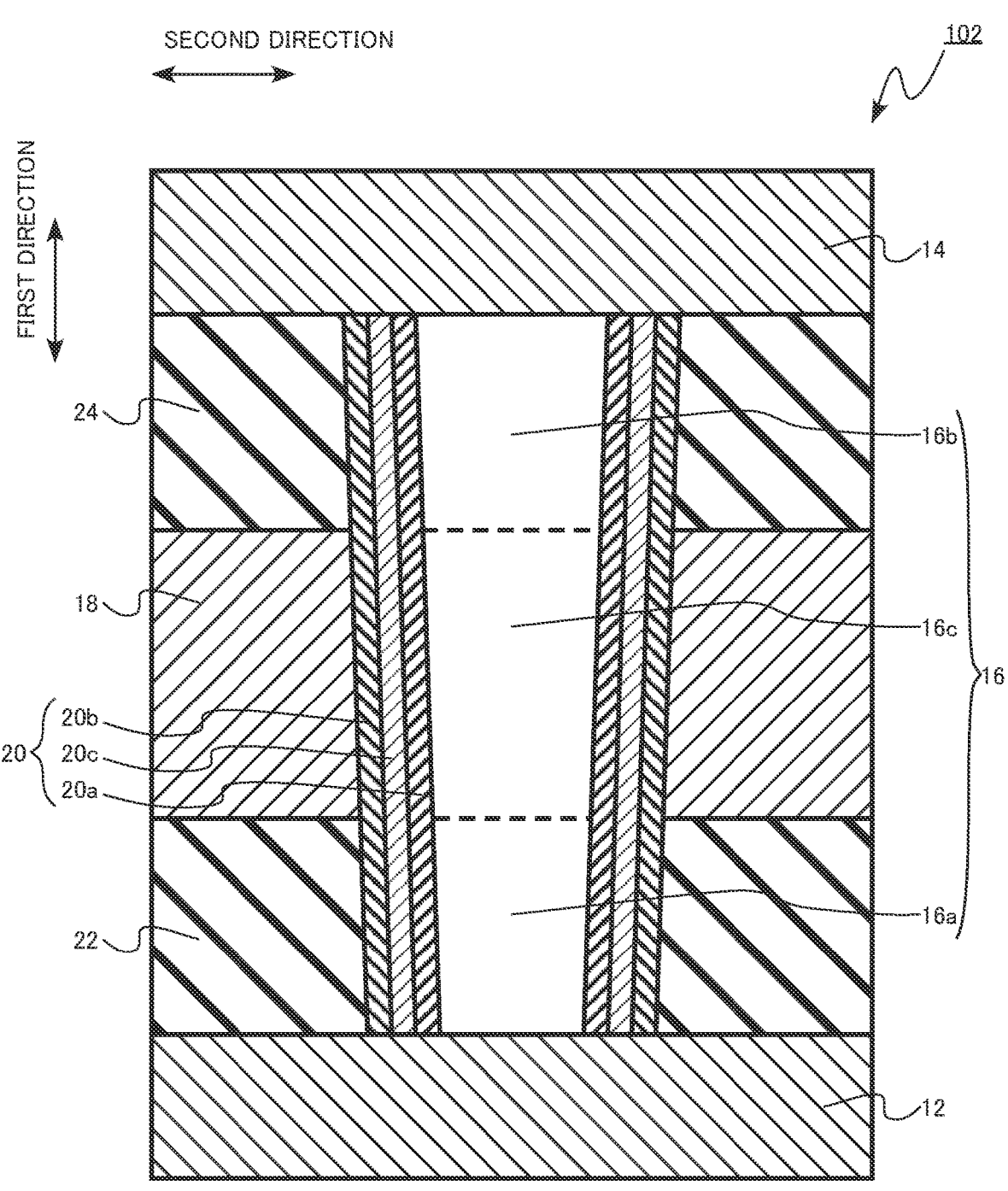
FIG. 10 is a schematic cross-sectional view of a semiconductor device according to a second modification example of the first embodiment.

FIG. 10 is a schematic cross-sectional view of a semiconductor device according to a second modification example of the first embodiment. The semiconductor device according to the second modification example of the first embodiment is different from the semiconductor device according to the first embodiment in that the oxide semiconductor layer has a tapered shape.

The semiconductor device according to the second modification example of the first embodiment includes a transistor 102.

The oxide semiconductor layer 16 has a tapered shape. The width of the oxide semiconductor layer 16 in the second direction increases from the first electrode 12 toward the second electrode 14.

As described above, according to the first embodiment and its modification examples, the on-current of the transistor increases at a desired threshold voltage. Therefore, a semiconductor device having excellent transistor characteristics is realized.

Second Embodiment

A semiconductor memory device according to a second embodiment includes the semiconductor device according to the first embodiment and a capacitor electrically connected to the first electrode or the second electrode.

The semiconductor memory device according to the second embodiment is a semiconductor memory 200. The semiconductor memory device according to the second embodiment is a DRAM. In the semiconductor memory 200, the transistor 100 according to the first embodiment is used as a switching transistor of a memory cell in a DRAM.

Hereinafter, the description of a part of the content overlapping the first embodiment will be omitted.

Figure 11:
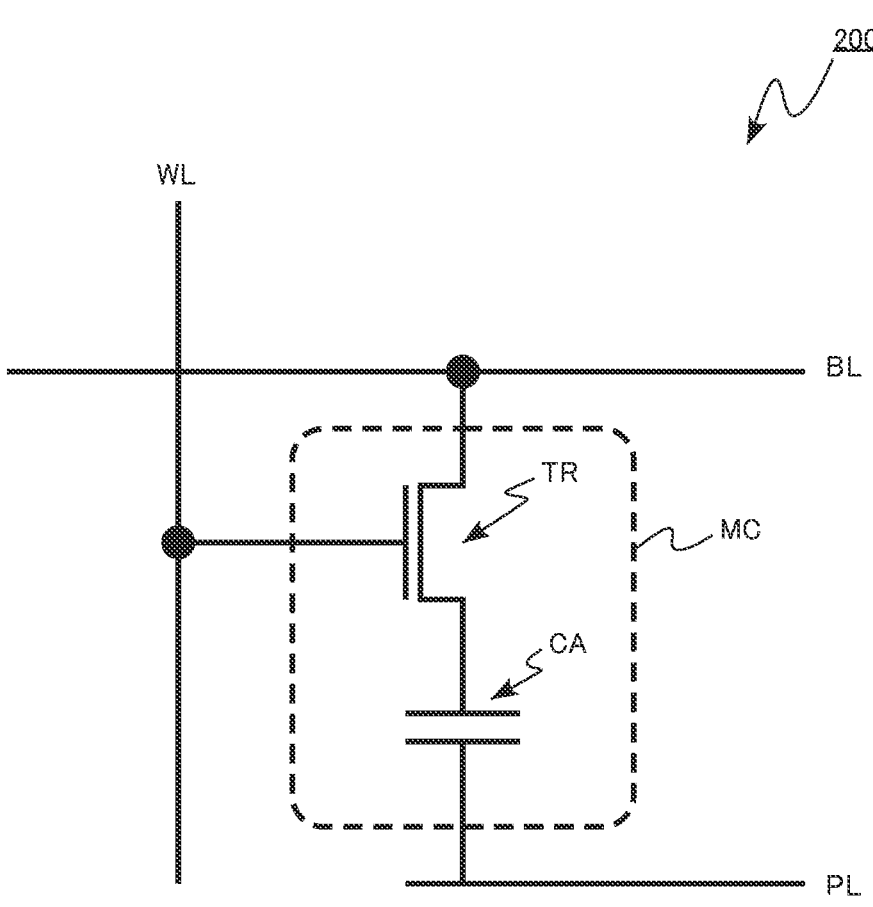
FIG. 11 is an equivalent circuit diagram of a semiconductor memory device according to a second embodiment.

FIG. 11 is an equivalent circuit diagram of the semiconductor memory device according to the second embodiment. FIG. 11 illustrates a case where one memory cell MC is provided. However, for example, a plurality of memory cells MC may be provided in an array. In addition, a plurality of memory cells MC may be arranged three-dimensionally, for example.

The semiconductor memory 200 includes the memory cell MC, a word line WL, a bit line BL, and a plate line PL. The memory cell MC includes a switching transistor TR and a capacitor CA. In FIG. 11, a region surrounded by the broken line is the memory cell MC.

The word line WL is electrically connected to the gate electrode of the switching transistor TR. The bit line BL is electrically connected to one of the source electrode and the drain electrode of the switching transistor TR. One electrode of the capacitor CA is electrically connected to the other one of the source electrode and the drain electrode of the switching transistor TR. The other electrode of the capacitor CA is connected to the plate line PL.

The memory cell MC stores data by storing charges in the capacitor CA. Data is written and read by turning on the switching transistor TR.

For example, data is written into the memory cell MC by turning on the switching transistor TR in a state in which a desired voltage is applied to the bit line BL.

In addition, for example, a voltage change in the bit line BL according to the amount of charge stored in the capacitor is detected by turning on the switching transistor TR, thereby reading the data of the memory cell MC.

Figure 12:
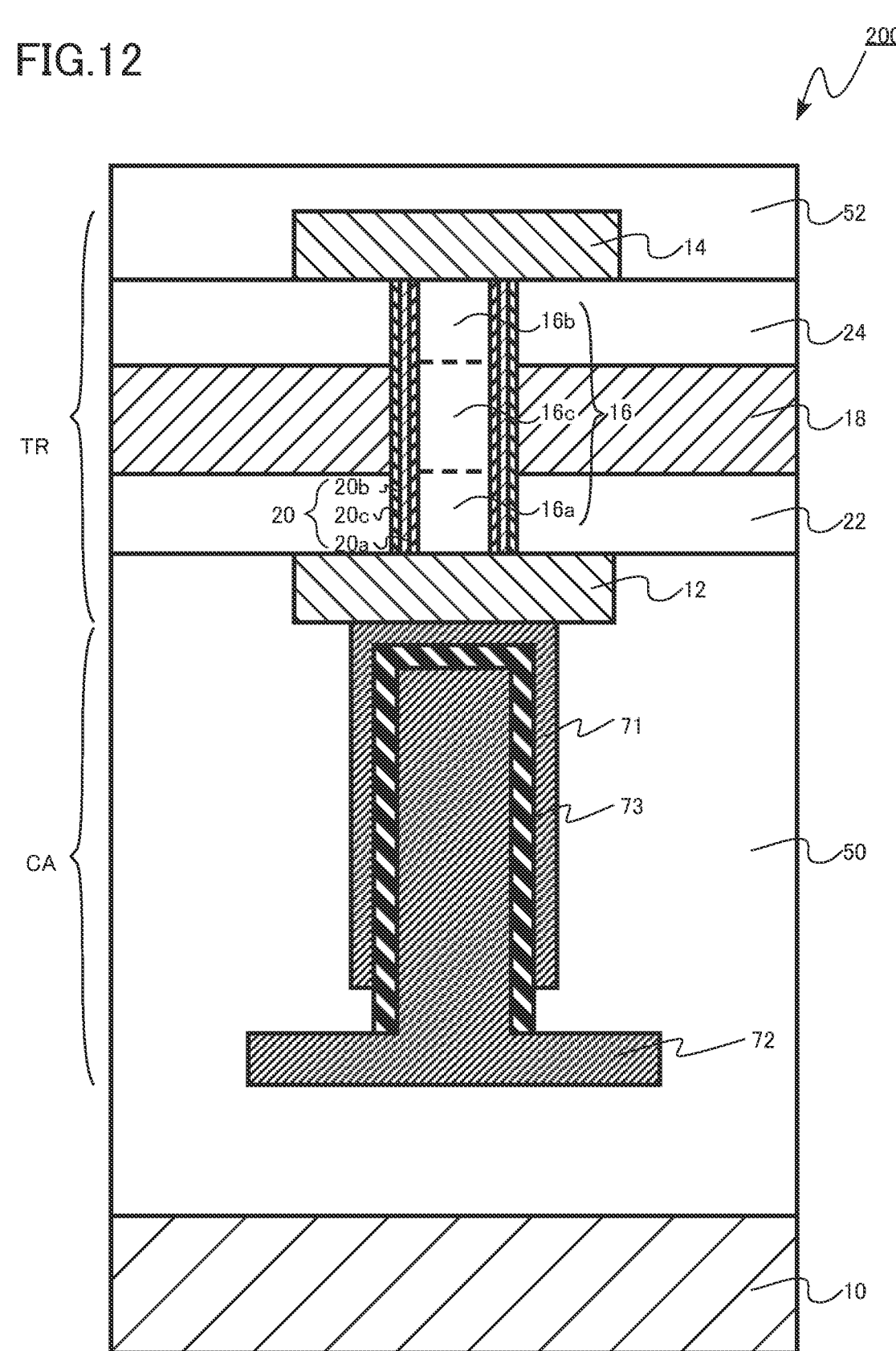
FIG. 12 is a schematic cross-sectional view of the semiconductor memory device according to the second embodiment.

FIG. 12 is a schematic cross-sectional view of the semiconductor memory device of the second embodiment. FIG. 12 shows a cross section of the memory cell MC of the semiconductor memory 200.

The semiconductor memory 200 includes a silicon substrate 10, the switching transistor TR, the capacitor CA, a first interlayer insulating layer 50, and a second interlayer insulating layer 52.

The silicon substrate 10 is, for example, single crystal silicon. The substrate may be, for example, a semiconductor substrate other than the silicon substrate. The substrate may be, for example, an insulating substrate.

The switching transistor TR includes a first electrode 12, a second electrode 14, an oxide semiconductor layer 16, a gate electrode 18, a gate insulating layer 20, a first insulating layer 22, and a second insulating layer 24. The gate insulating layer 20 includes a first portion 20a, a second portion 20b, and a third portion 20c.

The switching transistor TR has a structure similar to that of the transistor 100 according to the first embodiment.

The capacitor CA is provided between the silicon substrate 10 and the switching transistor TR. The capacitor CA is provided between the silicon substrate 10 and the first electrode 12. The capacitor CA is electrically connected to the first electrode 12.

The capacitor CA includes a cell electrode 71, a plate electrode 72, and a capacitor insulating film 73. The cell electrode 71 is electrically connected to the first electrode 12. The cell electrode 71 is in contact with, for example, the first electrode 12.

Each of the cell electrode 71 and the plate electrode 72 is, for example, a titanium nitride. The capacitor insulating film 73 has, for example, a stacked structure of zirconium oxide, aluminum oxide, and zirconium oxide.

The gate electrode 18 is electrically connected to, for example, the word line WL (not shown). The second electrode 14 is electrically connected to, for example, the bit line BL (not shown). The plate electrode 72 is electrically connected to, for example, the plate line PL (not shown).

In the semiconductor memory 200, an oxide semiconductor transistor having a very small channel leakage current during off operation is applied as the switching transistor TR. Therefore, a DRAM having an excellent charge storage characteristic is realized.

In addition, the semiconductor memory 200 includes the switching transistor TR with increased on-current. Therefore, for example, a DRAM with improved write/read speed is realized.

Up to now, the semiconductor memory 200 to which the transistor according to the first embodiment is applied has been described as an example. However, a semiconductor memory to which the transistor according to the first modification example or the second modification example of the first embodiment is applied may be used.

In addition, the capacitor CA may be a structure provided on the switching transistor TR. The capacitor CA may be electrically connected to the second electrode 14. A structure in which the switching transistor TR is provided between the silicon substrate 10 and the capacitor CA may be used.

As described above, according to the semiconductor memory 200 according to the second embodiment, the on-current of the switching transistor TR is increased. Therefore, a semiconductor memory device having excellent operating characteristics can be realized.

Third Embodiment

A semiconductor device according to a third embodiment includes: a first electrode; a second electrode; an oxide semiconductor layer provided between the first electrode and the second electrode and electrically connected to the first electrode and the second electrode; a gate electrode surrounded by the oxide semiconductor layer; and a gate insulating layer provided between the gate electrode and the oxide semiconductor layer, containing oxygen (O) and at least one metal element selected from a group consisting of aluminum (Al), hafnium (Hf), zirconium (Zr), lanthanum (La), yttrium (Y), zinc (Zn), indium (In), tin (Sn), and gallium (Ga), and having a chemical composition different from that of the oxide semiconductor layer.

Figure 13:
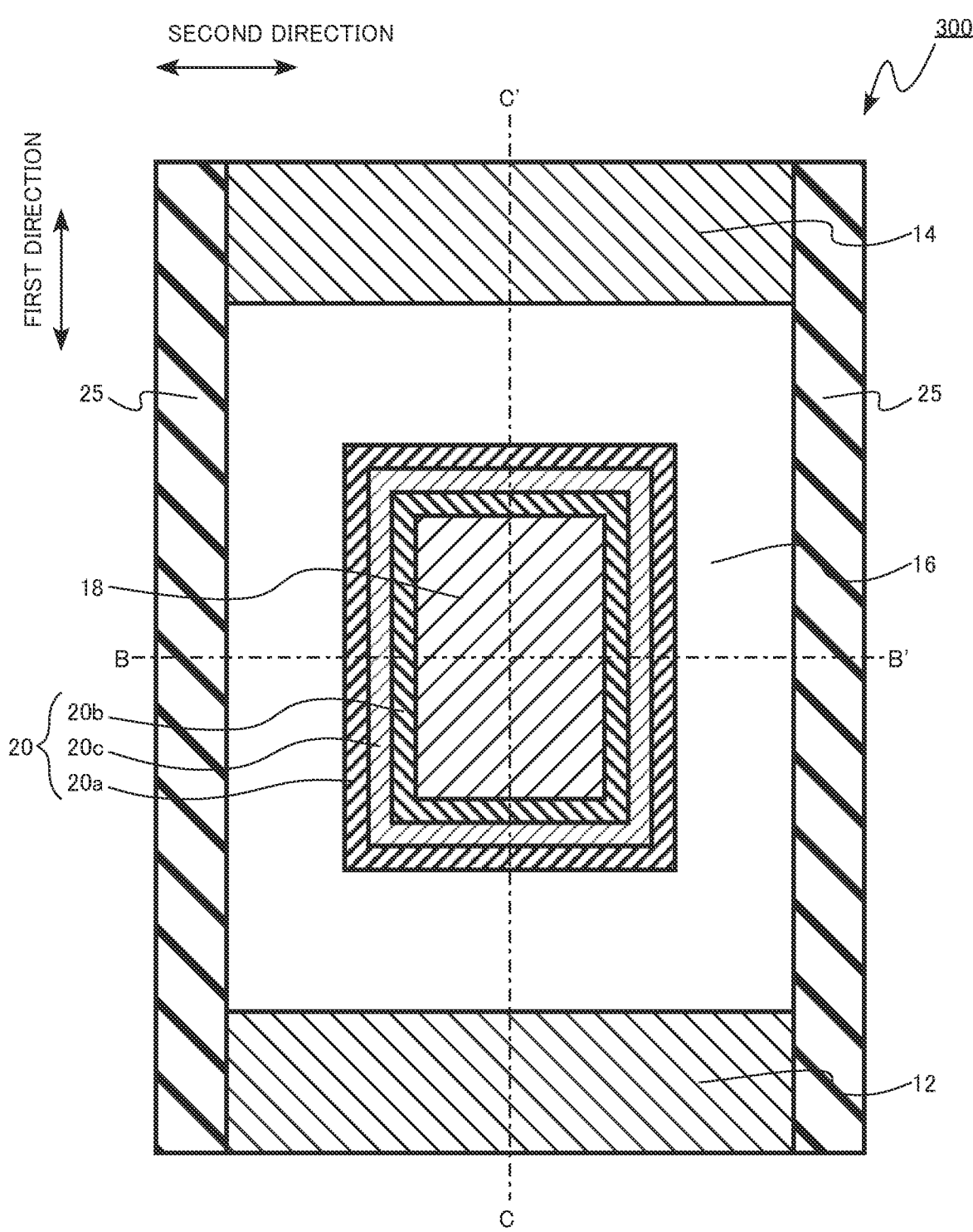
FIG. 13 is a schematic cross-sectional view of a semiconductor device according to a third embodiment.
Figure 14:
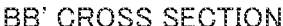
FIG. 14 is a schematic cross-sectional view of the semiconductor device according to the third embodiment.
Figure 15:
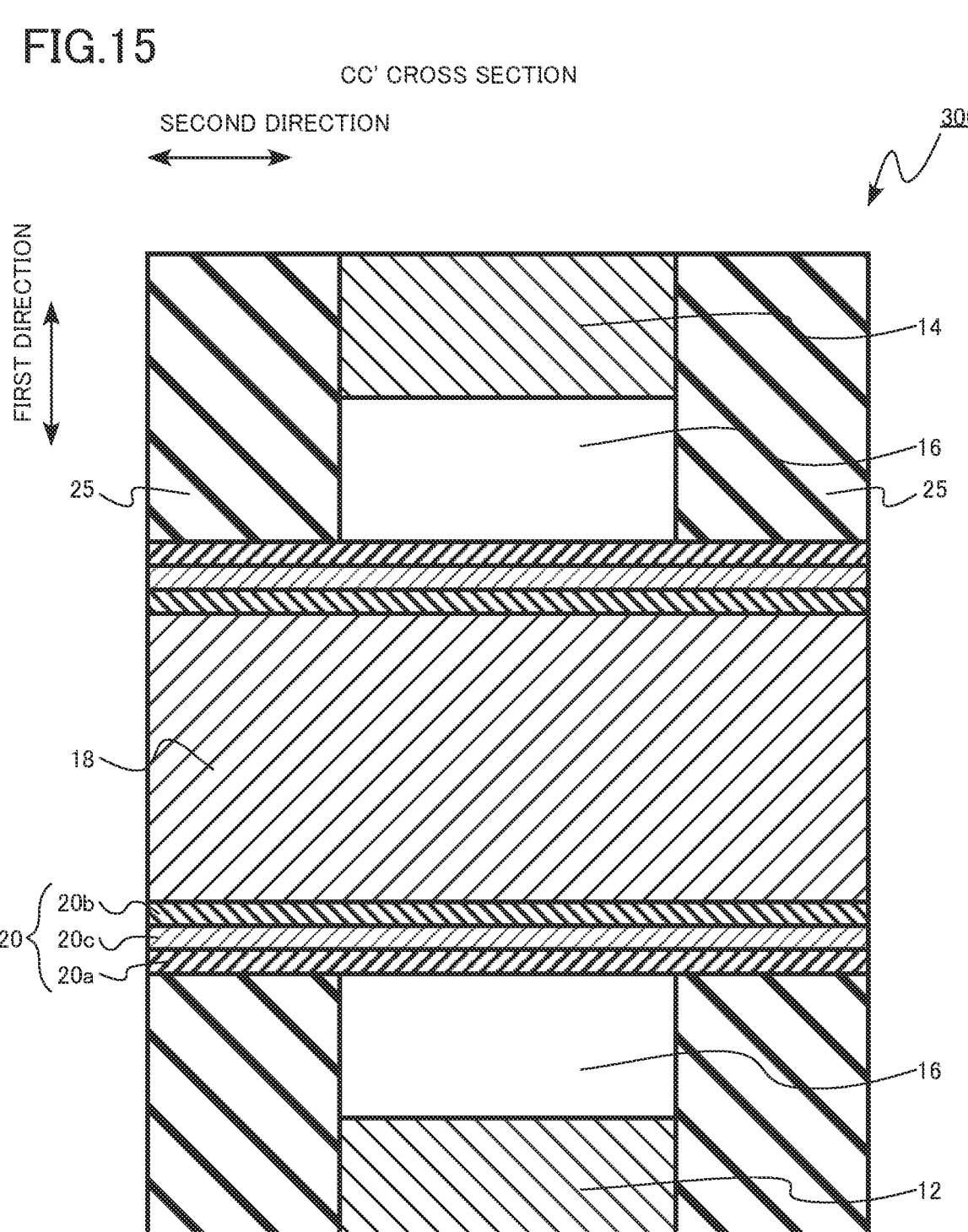
FIG. 15 is a schematic cross-sectional view of the semiconductor device of the third embodiment.

FIGS. 13, 14, and 15 are schematic cross-sectional views of the semiconductor device according to the third embodiment. FIG. 14 is a cross-sectional view taken along the line BB' of FIG. 13. FIG. 15 is a cross-sectional view taken along the line CC' of FIG. 13.

In FIG. 13, the vertical direction is referred to as a first direction. In FIG. 13, the horizontal direction is referred to as a second direction. In FIG. 14, the vertical direction is referred to as a third direction. The third direction is a direction perpendicular to the first direction and the second direction.

The semiconductor device according to the third embodiment is a transistor 300. The transistor 300 is an oxide semiconductor transistor in which a channel is formed in the oxide semiconductor. In the transistor 300, an oxide semiconductor layer in which a channel is formed is provided so as to surround a gate electrode.

The transistor 300 includes a first electrode 12, a second electrode 14, an oxide semiconductor layer 16, a gate electrode 18, a gate insulating layer 20, and an insulating layer 25. The gate insulating layer 20 includes a first portion 20a, a second portion 20b, and a third portion 20c.

The first electrode 12 functions as a source electrode or a drain electrode of the transistor 300.

The first electrode 12 is a conductor. The first electrode 12 contains, for example, an oxide conductor or a metal. The first electrode 12 is, for example, an oxide conductor containing indium (In), tin (Sn), and oxygen (O). The first electrode 12 is, for example, an indium tin oxide. The first electrode 12 is, for example, a metal containing tungsten (W), molybdenum (Mo), copper (Cu), aluminum (Al), titanium (Ti), nickel (Ni), platinum (Pt), or tantalum (Ta). The first electrode 12 is, for example, a titanium nitride or a nickel sulfide.

The first electrode 12 may have, for example, a stacked structure in which a plurality of conductors are stacked.

The second electrode 14 functions as a source electrode or a drain electrode of the transistor 300. The direction from the first electrode 12 toward the second electrode 14 is the first direction.

The second electrode 14 is a conductor. The second electrode 14 contains, for example, an oxide conductor or a metal. The second electrode 14 is, for example, an oxide conductor containing indium (In), tin (Sn), and oxygen (O). The second electrode 14 is, for example, an indium tin oxide. The second electrode 14 is, for example, a metal containing tungsten (W), molybdenum (Mo), copper (Cu), aluminum (Al), titanium (Ti), nickel (Ni), platinum (Pt), or tantalum (Ta). The second electrode 14 is, for example, a titanium nitride or a nickel sulfide.

The second electrode 14 may have, for example, a stacked structure in which a plurality of conductors are stacked.

The first electrode 12 and the second electrode 14 are formed of, for example, the same material. For example, the first electrode 12 and the second electrode 14 are oxide conductors containing indium (In), tin (Sn), and oxygen (O). Each of the first electrode 12 and the second electrode 14 is, for example, an indium tin oxide.

The oxide semiconductor layer 16 is provided between the first electrode 12 and the second electrode 14. The oxide semiconductor layer 16 is in contact with the first electrode 12. The oxide semiconductor layer 16 is in contact with the second electrode 14. The oxide semiconductor layer 16 is electrically connected to the first electrode 12 and the second electrode 14.

As shown in FIG. 13, the oxide semiconductor layer 16 surrounds the gate electrode 18 in a cross section parallel to the first direction and the second direction.

The oxide semiconductor layer 16 is an oxide semiconductor. The oxide semiconductor layer 16 is, for example, amorphous.

The oxide semiconductor layer 16 contains, for example, zinc (Zn), oxygen (O), and at least one element selected from a group consisting of indium (In), gallium (Ga), silicon (Si), aluminum (Al), and tin (Sn). The oxide semiconductor layer 16 contains, for example, indium (In), gallium (Ga), and zinc (Zn). The oxide semiconductor layer 16 contains, for example, indium (In), aluminum (Al), and zinc (Zn).

The oxide semiconductor layer 16 contains, for example, at least one element selected from a group consisting of titanium (Ti), zinc (Zn), and tungsten (W). For example, the oxide semiconductor layer 16 contains titanium oxide, zinc oxide, or tungsten oxide.

The oxide semiconductor layer 16 has a chemical composition different from the chemical composition of the first electrode 12 and the chemical composition of the second electrode 14, for example.

The oxide semiconductor layer 16 includes, for example, oxygen vacancies. Oxygen vacancies in the oxide semiconductor layer 16 function as donors for supplying electrons to the oxide semiconductor layer 16.

The gate electrode 18 faces the oxide semiconductor layer 16. As shown in FIG. 13, the gate electrode 18 is surrounded by the oxide semiconductor layer 16.

The gate electrode 18 is, for example, a metal, a metal compound, or a semiconductor. The gate electrode 18 contains, for example, tungsten (W).

The gate insulating layer 20 is provided between the gate electrode 18 and the oxide semiconductor layer 16. As shown in FIG. 13, the gate insulating layer 20 is surrounded by the oxide semiconductor layer 16. The gate insulating layer 20 is in contact with the oxide semiconductor layer 16.

The gate insulating layer 20 has a chemical composition different from that of the oxide semiconductor layer 16.

The gate insulating layer 20 contains oxygen (O) and at least one metal element selected from a group consisting of aluminum (Al), hafnium (Hf), zirconium (Zr), lanthanum (La), yttrium (Y), zinc (Zn), indium (In), tin (Sn), and gallium (Ga). The gate insulating layer 20 contains, for example, a metal oxide that is an oxide of the above-described at least one metal element.

The gate insulating layer 20 contains, for example, at least one metal oxide selected from a group consisting of aluminum oxide, hafnium oxide, zirconium oxide, lanthanum oxide, yttrium oxide, zinc oxide, indium oxide, tin oxide, and gallium oxide.

The gate insulating layer 20 contains, for example, silicon (Si). The gate insulating layer 20 contains, for example, silicon oxide.

The gate insulating layer 20 contains, for example, silicon (Si) and nitrogen (N). The gate insulating layer 20 contains, for example, silicon nitride or silicon oxynitride.

The gate insulating layer 20 includes, for example, a first portion 20a, a second portion 20b, and a third portion 20c. The third portion 20c is provided between the first portion 20a and the second portion 20b. The first portion 20a is provided between the oxide semiconductor layer 16 and the second portion 20b.

The first portion 20a, the second portion 20b, and the third portion 20c form, for example, a three-layer structure. The first portion 20a, the second portion 20b, and the third portion 20c form, for example, a stacked structure.

The first portion 20a is in contact with, for example, the oxide semiconductor layer 16. The second portion 20b is in contact with, for example, the gate electrode 18.

The first portion 20a contains silicon (Si) and oxygen (O). The first portion 20a contains, for example, silicon oxide. The first portion 20a is, for example, a silicon oxide.

The second portion 20b contains silicon (Si) and nitrogen (N). The second portion 20b contains, for example, silicon nitride or silicon oxynitride. The second portion 20b is, for example, a silicon nitride or a silicon oxynitride.

The third portion 20c contains oxygen (O) and at least one metal element selected from a group consisting of aluminum (Al), hafnium (Hf), zirconium (Zr), lanthanum (La), yttrium (Y), zinc (Zn), indium (In), tin (Sn), and gallium (Ga). The gate insulating layer 20 contains, for example, a metal oxide that is an oxide of the above-described at least one metal element.

The third portion 20c contains, for example, at least one metal oxide selected from a group consisting of aluminum oxide, hafnium oxide, zirconium oxide, lanthanum oxide, yttrium oxide, zinc oxide, indium oxide, tin oxide, and gallium oxide. The third portion 20c is, for example, an aluminum oxide, a hafnium oxide, a zirconium oxide, a lanthanum oxide, an yttrium oxide, a zinc oxide, an indium oxide, a tin oxide, or a gallium oxide.

For example, the atomic concentration of the above-described at least one metal element in the third portion 20c is higher than the atomic concentration of the above-described at least one metal element in the first portion 20a and the second portion 20b. For example, when the above-described at least one metal element is aluminum (Al), the atomic concentration of aluminum (Al) in the third portion 20c is higher than the atomic concentration of aluminum (Al) in the first portion 20a and the second portion 20b.

For example, the atomic concentration of nitrogen (N) in the second portion 20b is higher than the atomic concentration of nitrogen (N) in the first portion 20a and the third portion 20c.

The gate insulating layer 20 contains, for example, at least one element selected from a group consisting of nitrogen (N), carbon (C), hydrogen (H), and chlorine (Cl).

The thickness of the gate insulating layer 20 in a direction from the oxide semiconductor layer 16 toward the gate electrode 18 is, for example, equal to or more than 2 nm and equal to or less than 10 nm. For example, the thickness of the gate insulating layer 20 in the second direction is equal to or more than 2 nm and equal to or less than 10 nm.

The thickness of the third portion 20c in a direction from the oxide semiconductor layer 16 toward the gate electrode 18 is, for example, equal to or more than 0.5 nm and equal to or less than 3 nm. For example, the thickness of the third portion 20c in the second direction is equal to or more than 0.5 nm and equal to or less than 3 nm.

The insulating layer 25 contains, for example, oxygen (O). The insulating layer 25 contains, for example, oxide.

The insulating layer 25 contains, for example, silicon (Si) and oxygen (O). The insulating layer 25 contains, for example, silicon oxide. The insulating layer 25 is, for example, a silicon oxide.

Next, the function and effect of the semiconductor device according to the third embodiment will be described.

An oxide semiconductor transistor in which a channel is formed in an oxide semiconductor layer has an excellent characteristic that the channel leakage current during off operation is very small. For this reason, for example, the oxide semiconductor transistor can be applied as a switching transistor of a memory cell in a DRAM. By applying the oxide semiconductor transistor as a switching transistor, the charge storage characteristic of the DRAM is improved.

For example, in order to improve the write/read speed of a DRAM, it is desired to increase the on-current of the switching transistor. There is a trade-off relationship between the threshold voltage and the on-current of the oxide semiconductor transistor. In other words, the on-current decreases as the threshold voltage of the oxide semiconductor transistor increases, and the on-current increases as the threshold voltage decreases.

The gate insulating layer 20 of the transistor 300 according to the third embodiment contains oxygen (O) and at least one metal element selected from a group consisting of aluminum (Al), hafnium (Hf), zirconium (Zr), lanthanum (La), yttrium (Y), zinc (Zn), indium (In), tin (Sn), and gallium (Ga).

In the transistor 300 according to the third embodiment, since the gate insulating layer 20 contains the above-described at least one metal element and oxygen (O), the trade-off between the threshold voltage and the on-current is improved. Therefore, it is possible to increase the on-current at a desired threshold voltage.

It is thought that the reason why the trade-off between the threshold voltage and the on-current is improved by the gate insulating layer 20 containing the above-described at least one metal element and oxygen (O) is that a fixed charge or dipole is formed in the gate insulating layer 20 to increase the threshold voltage of the transistor 300.

The gate insulating layer 20 of the transistor 300 according to the third embodiment preferably includes the first portion 20a containing silicon (Si) and oxygen (O). By providing the first portion 20a, for example, the trap level in the gate insulating layer 20 can be reduced. Therefore, for example, the gate leakage current of the transistor 300 can be reduced.

In addition, for example, by providing the first portion 20a, the interface state at the interface between the gate insulating layer 20 and the oxide semiconductor layer 16 can be reduced. Therefore, for example, the mobility of carriers is improved and the on-current of the transistor 300 is increased.

The gate insulating layer 20 of the transistor 300 according to the third embodiment preferably includes the second portion 20b containing silicon (Si) and nitrogen (N). By providing the second portion 20b, for example, the metal contained in the gate electrode 18 diffuses into the gate insulating layer 20. As a result, it is possible to suppress an increase in leakage current of the gate insulating layer 20 or a decrease in reliability of the gate insulating layer 20.

The gate insulating layer 20 of the transistor 300 according to the third embodiment preferably contains at least one element selected from a group consisting of nitrogen (N), carbon (C), hydrogen (H), and chlorine (Cl).

When the gate insulating layer 20 contains nitrogen (N) or carbon (C), for example, the diffusion of the metal contained in the gate electrode 18 into the gate insulating layer 20 is suppressed. As a result, it is possible to reduce the leakage current of the gate insulating layer 20 or improve the reliability of the gate insulating layer 20.

When the gate insulating layer 20 contains hydrogen (H) or chlorine (Cl), for example, the trap level in the gate insulating layer 20 is reduced. As a result, it is possible to reduce the leakage current of the gate insulating layer 20 or improve the reliability of the gate insulating layer 20.

Although the case where the above-described at least one metal element contained in the gate insulating layer 20 is aluminum (Al) has been mainly described, the same function and effect as in the case of aluminum (Al) can be realized even if the above-described at least one metal element is other than aluminum (Al).

In addition, although the case where the gate insulating layer 20 has a three-layer structure including the first portion 20a, the second portion 20b, and the third portion 20c has been described as an example, the gate insulating layer 20 is not limited to the three-layer structure described above. For example, the gate insulating layer 20 may have a single-layer structure, a two-layer structure, or a four-layer or more structure.

According to the transistor 300 according to the third embodiment, it is possible to increase the on-current at a desired threshold voltage.

As described above, according to the third embodiment, the on-current of the transistor increases at a desired threshold voltage. Therefore, a semiconductor device having excellent transistor characteristics is realized.

Fourth Embodiment

A semiconductor memory device according to a fourth embodiment includes the semiconductor device according to the third embodiment and a capacitor electrically connected to the first electrode or the second electrode.

The semiconductor memory device according to the fourth embodiment is a semiconductor memory 400. The semiconductor memory device according to the fourth embodiment is a DRAM. In the semiconductor memory 400, the transistor 300 according to the third embodiment is used as a switching transistor of a memory cell in a DRAM.

Hereinafter, the description of a part of the content overlapping the third embodiment will be omitted.

The equivalent circuit diagram of the semiconductor memory device according to the fourth embodiment is the same as that of the semiconductor memory device according to the second embodiment shown in FIG. 11. FIG. 11 illustrates a case where one memory cell MC is provided. However, for example, a plurality of memory cells MC may be provided in an array. In addition, a plurality of memory cells MC may be arranged three-dimensionally, for example.

As shown in FIG. 11, the semiconductor memory 400 includes the memory cell MC, a word line WL, a bit line BL, and a plate line PL. The memory cell MC includes a switching transistor TR and a capacitor CA.

The word line WL is electrically connected to the gate electrode of the switching transistor TR. The bit line BL is electrically connected to one of the source electrode and the drain electrode of the switching transistor TR. One electrode of the capacitor CA is electrically connected to the other one of the source electrode and the drain electrode of the switching transistor TR. The other electrode of the capacitor CA is electrically connected to the plate line PL.

The memory cell MC stores data by storing charges in the capacitor CA. Data is written and read by turning on the switching transistor TR.

For example, data is written into the memory cell MC by turning on the switching transistor TR in a state in which a desired voltage is applied to the bit line BL.

In addition, for example, a voltage change in the bit line BL according to the amount of charge stored in the capacitor is detected by turning on the switching transistor TR, thereby reading the data of the memory cell MC.

Figure 16:
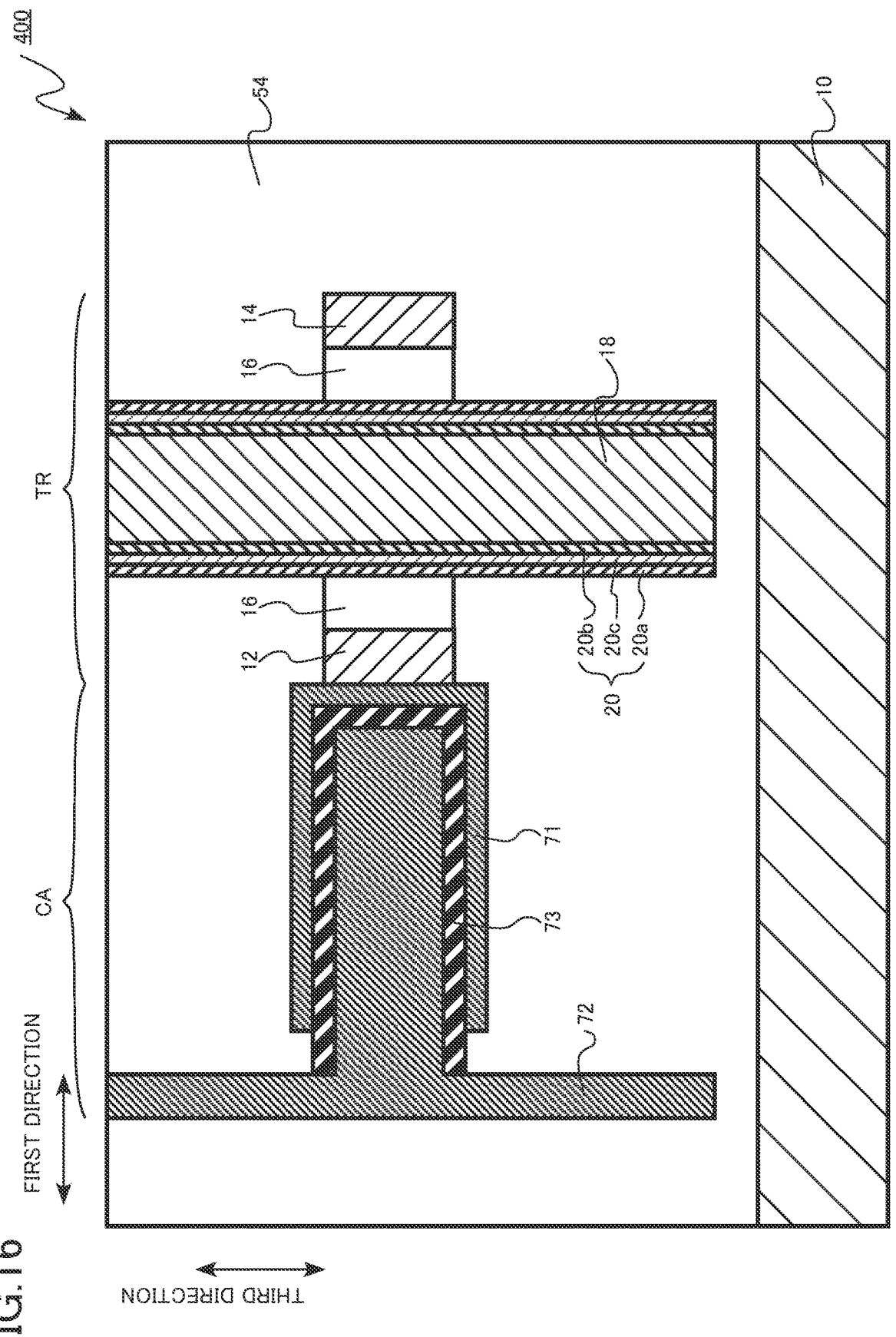
FIG. 16 is a schematic cross-sectional view of a semiconductor memory device according to a fourth embodiment.

FIG. 16 is a schematic cross-sectional view of the semiconductor memory device according to the fourth embodiment. FIG. 16 shows a cross section of the memory cell MC of the semiconductor memory 400.

The semiconductor memory 400 includes a silicon substrate 10, the switching transistor TR, the capacitor CA, and an interlayer insulating layer 54.

The silicon substrate 10 is, for example, single crystal silicon. The substrate may be, for example, a semiconductor substrate other than the silicon substrate. The substrate may be, for example, an insulating substrate.

The switching transistor TR includes a first electrode 12, a second electrode 14, an oxide semiconductor layer 16, a gate electrode 18, and a gate insulating layer 20. The gate insulating layer 20 includes a first portion 20a, a second portion 20b, and a third portion 20c.

The switching transistor TR has a structure similar to that of the transistor 300 of the third embodiment.

The first direction from the first electrode 12 to the second electrode 14 is parallel to the surface of the silicon substrate 10, for example. The gate electrode 18 extends, for example, in the third direction perpendicular to the surface of the silicon substrate 10.

The capacitor CA is provided in the first direction of the switching transistor TR. The capacitor CA is electrically connected to the first electrode 12.

The capacitor CA includes a cell electrode 71, a plate electrode 72, and a capacitor insulating film 73. The cell electrode 71 is electrically connected to the first electrode 12. The cell electrode 71 is in contact with, for example, the first electrode 12.

Each of the cell electrode 71 and the plate electrode 72 is, for example, a titanium nitride. The capacitor insulating film 73 has, for example, a stacked structure of zirconium oxide, aluminum oxide, and zirconium oxide.

The gate electrode 18 is electrically connected to, for example, the word line WL (not shown). The second electrode 14 is electrically connected to, for example, the bit line BL (not shown). The plate electrode 72 is connected to, for example, the plate line PL (not shown).

In the semiconductor memory 400, an oxide semiconductor transistor having a very small channel leakage current during off operation is applied as the switching transistor TR. Therefore, a DRAM having an excellent charge storage characteristic is realized.

In addition, the semiconductor memory 400 includes the switching transistor TR with increased on-current. Therefore, for example, a DRAM with improved write/read speed is realized.

For example, in FIG. 16, a plurality of memory cells MC having the common gate electrode 18 and plate electrode 72 may be stacked in the third direction perpendicular to the surface of the silicon substrate 10.

As described above, according to the semiconductor memory 400 according to the fourth embodiment, the on-current of the switching transistor TR is increased. Therefore, a semiconductor memory device having excellent operating characteristics can be realized.

Fifth Embodiment

A semiconductor device according to a fifth embodiment includes: a first electrode; a second electrode; an oxide semiconductor layer provided between the first electrode and the second electrode and electrically connected to the first electrode and the second electrode; a gate electrode surrounding the oxide semiconductor layer; and a gate insulating layer provided between the gate electrode and the oxide semiconductor layer, containing oxygen (O) and at least one metal element selected from a group consisting of aluminum (Al), hafnium (Hf), zirconium (Zr), lanthanum (La), yttrium (Y), zinc (Zn), indium (In), tin (Sn), and gallium (Ga), and having a chemical composition different from that of the oxide semiconductor layer.

Figure 17:
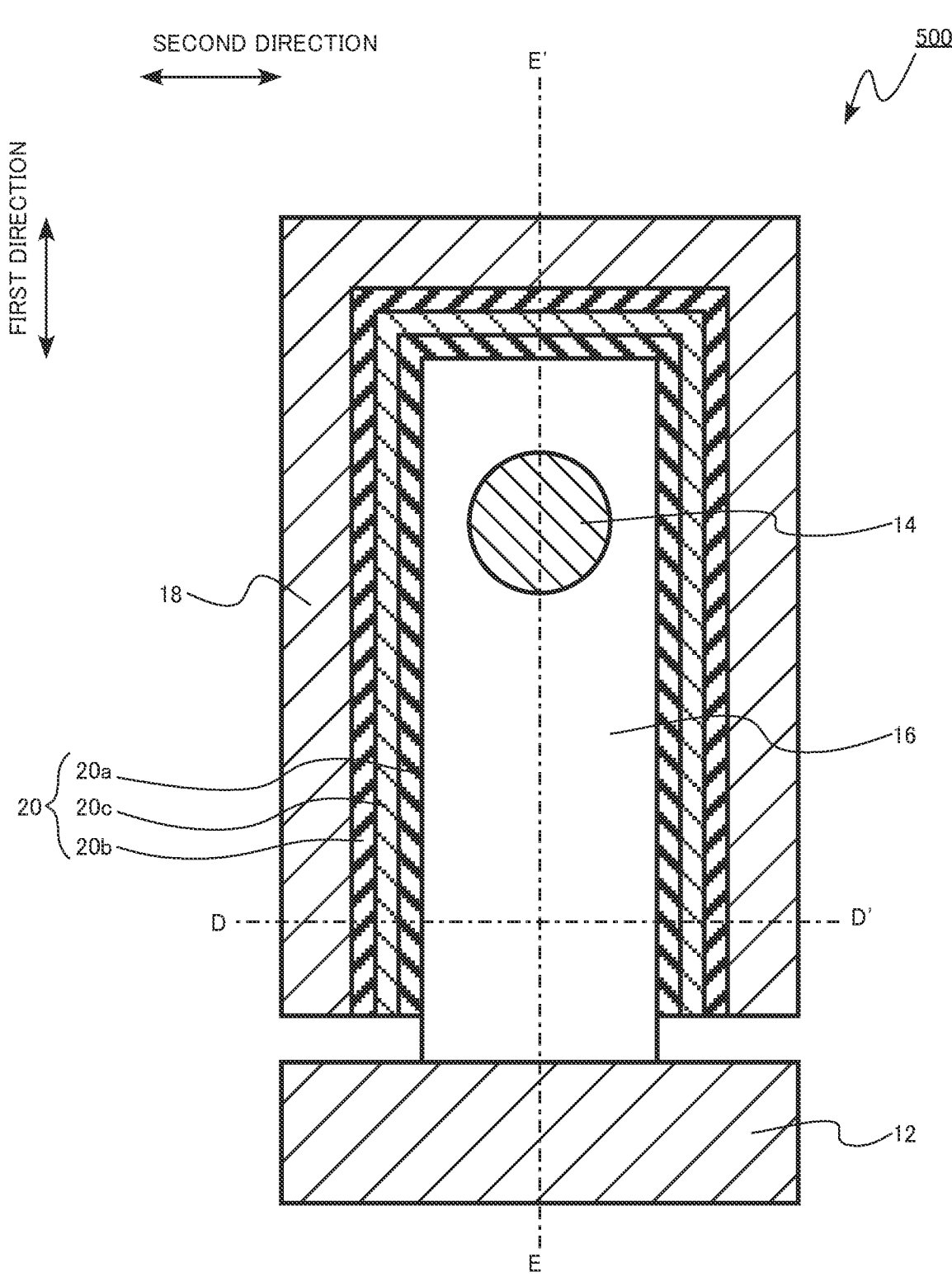
FIG. 17 is a schematic cross-sectional view of a semiconductor device according to a fifth embodiment.
Figure 18:
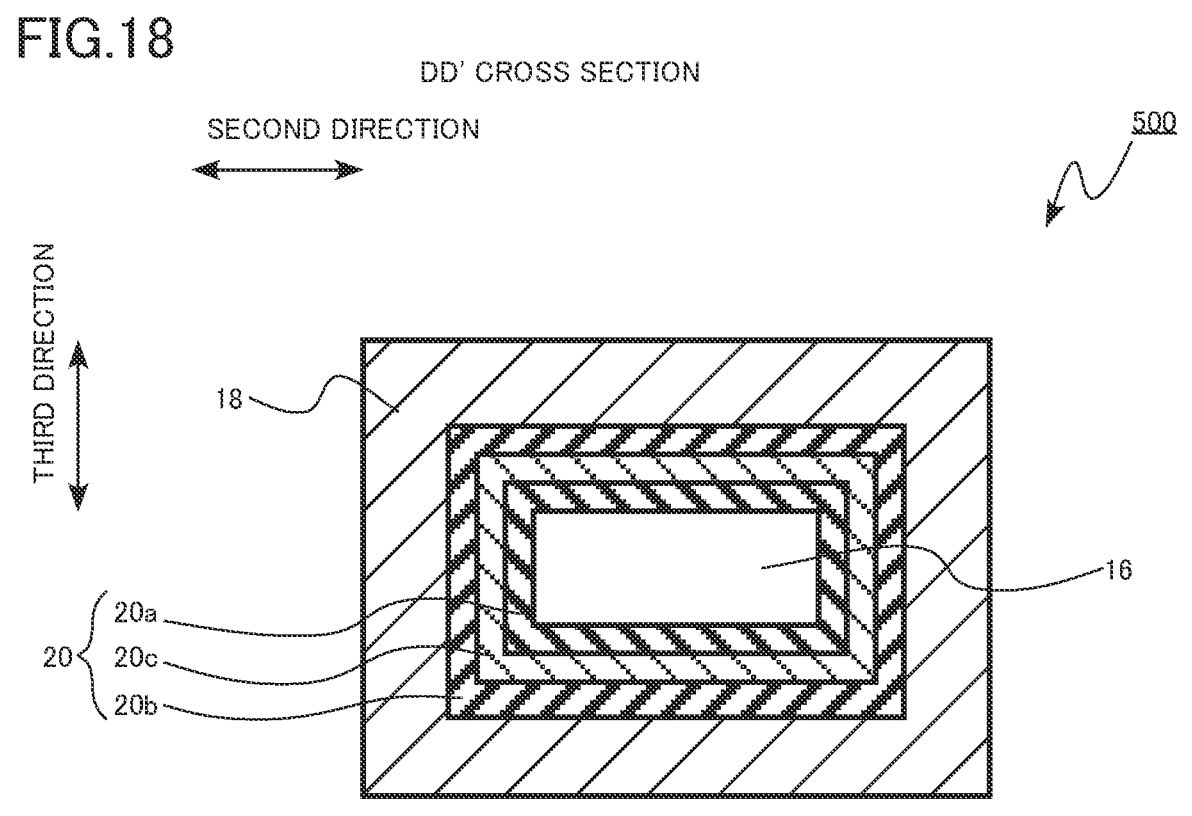
Figure 19:
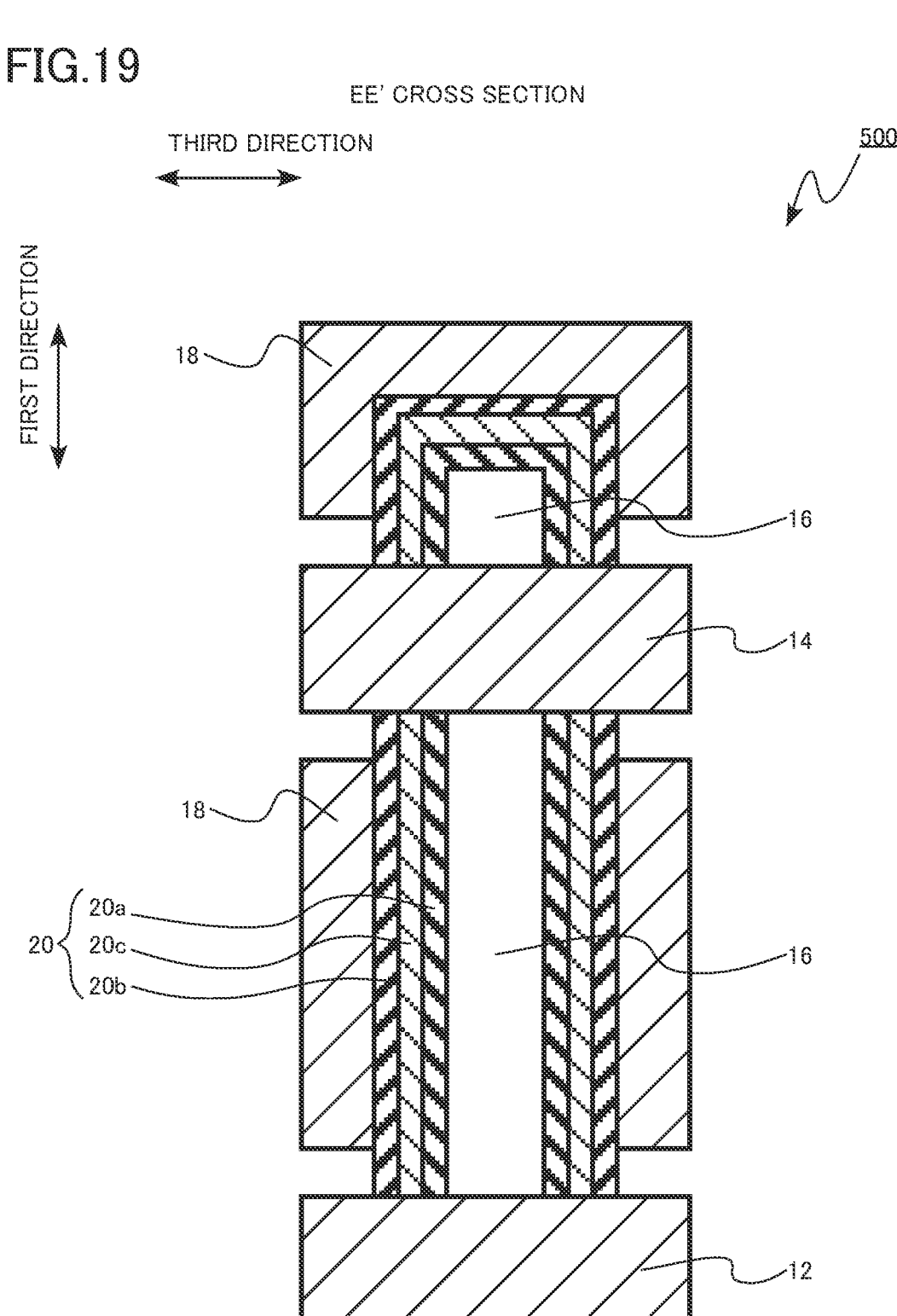
FIG. 19 is a schematic cross-sectional view of the semiconductor device according to the fifth embodiment.

FIGS. 17, 18, and 19 are schematic cross-sectional views of the semiconductor device according to the fifth embodiment. FIG. 18 is a cross-sectional view taken along the line DD' of FIG. 17. FIG. 19 is a cross-sectional view taken along the line EE' of FIG. 17.

In FIG. 17, the vertical direction is referred to as a first direction. In FIG. 17, the horizontal direction is referred to as a second direction. In FIG. 18, the vertical direction is referred to as a third direction. The third direction is a direction perpendicular to the first direction and the second direction.

The semiconductor device according to the fifth embodiment is a transistor 500. The transistor 500 is an oxide semiconductor transistor in which a channel is formed in the oxide semiconductor. In the transistor 500, a gate electrode surrounds an oxide semiconductor layer in which a channel is formed. The transistor 100 is a so-called surrounding gate transistor (SGT).

The transistor 500 includes a first electrode 12, a second electrode 14, an oxide semiconductor layer 16, a gate electrode 18, and a gate insulating layer 20. The gate insulating layer 20 includes a first portion 20a, a second portion 20b, and a third portion 20c.

The first electrode 12 functions as a source electrode or a drain electrode of the transistor 500.

The first electrode 12 is a conductor. The first electrode 12 contains, for example, an oxide conductor or a metal. The first electrode 12 is, for example, an oxide conductor containing indium (In), tin (Sn), and oxygen (O). The first electrode 12 is, for example, an indium tin oxide. The first electrode 12 is, for example, a metal containing tungsten (W), molybdenum (Mo), copper (Cu), aluminum (Al), titanium (Ti), nickel (Ni), platinum (Pt), or tantalum (Ta). The first electrode 12 is, for example, a titanium nitride or a nickel sulfide.

The first electrode 12 may have, for example, a stacked structure in which a plurality of conductors are stacked.

The second electrode 14 functions as a source electrode or a drain electrode of the transistor 500. The direction from the first electrode 12 toward the second electrode 14 is the first direction. The second electrode 14 is surrounded by the oxide semiconductor layer 16.

The second electrode 14 is a conductor. The second electrode 14 contains, for example, an oxide conductor or a metal. The second electrode 14 is, for example, an oxide conductor containing indium (In), tin (Sn), and oxygen (O). The second electrode 14 is, for example, an indium tin oxide. The second electrode 14 is, for example, a metal containing tungsten (W), molybdenum (Mo), copper (Cu), aluminum (Al), titanium (Ti), nickel (Ni), platinum (Pt), or tantalum (Ta). The second electrode 14 is, for example, a titanium nitride or a nickel sulfide.

The second electrode 14 may have, for example, a stacked structure in which a plurality of conductors are stacked.

The first electrode 12 and the second electrode 14 are formed of, for example, the same material. For example, the first electrode 12 and the second electrode 14 are oxide conductors containing indium (In), tin (Sn), and oxygen (O). Each of the first electrode 12 and the second electrode 14 is, for example, an indium tin oxide.

The oxide semiconductor layer 16 is provided between the first electrode 12 and the second electrode 14. The oxide semiconductor layer 16 is in contact with the first electrode 12. The oxide semiconductor layer 16 is in contact with the second electrode 14. The oxide semiconductor layer 16 is electrically connected to the first electrode 12 and the second electrode 14.

As shown in FIG. 17, the oxide semiconductor layer 16 surrounds the second electrode 14 in a cross section parallel to the first direction and the second direction.

The oxide semiconductor layer 16 is an oxide semiconductor. The oxide semiconductor layer 16 is, for example, amorphous.

The oxide semiconductor layer 16 contains, for example, zinc (Zn), oxygen (O), and at least one element selected from a group consisting of indium (In), gallium (Ga), silicon (Si), aluminum (Al), and tin (Sn). The oxide semiconductor layer 16 contains, for example, indium (In), gallium (Ga), and zinc (Zn). The oxide semiconductor layer 16 contains, for example, indium (In), aluminum (Al), and zinc (Zn).

The oxide semiconductor layer 16 contains, for example, at least one element selected from a group consisting of titanium (Ti), zinc (Zn), and tungsten (W). For example, the oxide semiconductor layer 16 contains titanium oxide, zinc oxide, or tungsten oxide.

The oxide semiconductor layer 16 has, for example, a chemical composition different from the chemical composition of the first electrode 12 and the chemical composition of the second electrode 14.

The oxide semiconductor layer 16 includes, for example, oxygen vacancies. Oxygen vacancies in the oxide semiconductor layer 16 function as donors for supplying electrons to the oxide semiconductor layer 16.

The gate electrode 18 faces the oxide semiconductor layer 16. As shown in FIG. 18, the gate electrode 18 surrounds the oxide semiconductor layer 16 in a cross section parallel to the second direction and the third direction.

The gate electrode 18 is, for example, a metal, a metal compound, or a semiconductor. The gate electrode 18 contains, for example, tungsten (W).

The gate insulating layer 20 is provided between the gate electrode 18 and the oxide semiconductor layer 16. As shown in FIG. 18, the gate insulating layer 20 surrounds the oxide semiconductor layer 16. The gate insulating layer 20 is in contact with the oxide semiconductor layer 16.

The gate insulating layer 20 has a chemical composition different from that of the oxide semiconductor layer 16.

The gate insulating layer 20 contains oxygen (O) and at least one metal element selected from a group consisting of aluminum (Al), hafnium (Hf), zirconium (Zr), lanthanum (La), yttrium (Y), zinc (Zn), indium (In), tin (Sn), and gallium (Ga). The gate insulating layer 20 contains, for example, a metal oxide that is an oxide of the above-described at least one metal element.

The gate insulating layer 20 contains, for example, at least one metal oxide selected from a group consisting of aluminum oxide, hafnium oxide, zirconium oxide, lanthanum oxide, yttrium oxide, zinc oxide, indium oxide, tin oxide, and gallium oxide.

The gate insulating layer 20 contains, for example, silicon (Si). The gate insulating layer 20 contains, for example, silicon oxide.

The gate insulating layer 20 contains, for example, silicon (Si) and nitrogen (N). The gate insulating layer 20 contains, for example, silicon nitride or silicon oxynitride.

The gate insulating layer 20 includes, for example, the first portion 20a, the second portion 20b, and the third portion 20c. The third portion 20c is provided between the first portion 20a and the second portion 20b. The first portion 20a is provided between the oxide semiconductor layer 16 and the second portion 20b.

The first portion 20a, the second portion 20b, and the third portion 20c form, for example, a three-layer structure. The first portion 20a, the second portion 20b, and the third portion 20c form, for example, a stacked structure.

The first portion 20a is in contact with, for example, the oxide semiconductor layer 16. The second portion 20b is in contact with, for example, the gate electrode 18.

The first portion 20a contains silicon (Si) and oxygen (O). The first portion 20a contains, for example, silicon oxide. The first portion 20a is, for example, a silicon oxide.

The second portion 20b contains silicon (Si) and nitrogen (N). The second portion 20b contains, for example, silicon nitride or silicon oxynitride. The second portion 20b is, for example, a silicon nitride or a silicon oxynitride.

The third portion 20c contains oxygen (O) and at least one metal element selected from a group consisting of aluminum (Al), hafnium (Hf), zirconium (Zr), lanthanum (La), yttrium (Y), zinc (Zn), indium (In), tin (Sn), and gallium (Ga). The gate insulating layer 20 contains, for example, a metal oxide that is an oxide of the above-described at least one metal element.

The third portion 20c contains, for example, at least one metal oxide selected from a group consisting of aluminum oxide, hafnium oxide, zirconium oxide, lanthanum oxide, yttrium oxide, zinc oxide, indium oxide, tin oxide, and gallium oxide. The third portion 20c is, for example, an aluminum oxide, a hafnium oxide, a zirconium oxide, a lanthanum oxide, an yttrium oxide, a zinc oxide, an indium oxide, a tin oxide, or a gallium oxide.

For example, the atomic concentration of the above-described at least one metal element in the third portion 20c is higher than the atomic concentration of the above-described at least one metal element in the first portion 20a and the second portion 20b. For example, when the above-described at least one metal element is aluminum (Al), the atomic concentration of aluminum (Al) in the third portion 20c is higher than the atomic concentration of aluminum (Al) in the first portion 20a and the second portion 20b.

For example, the atomic concentration of nitrogen (N) in the second portion 20b is higher than the atomic concentration of nitrogen (N) in the first portion 20a and the third portion 20c.

The gate insulating layer 20 contains, for example, at least one element selected from a group consisting of nitrogen (N), carbon (C), hydrogen (H), and chlorine (Cl).

The thickness of the gate insulating layer 20 in a direction from the oxide semiconductor layer 16 toward the gate electrode 18 is, for example, equal to or more than 2 nm and equal to or less than 10 nm. For example, the thickness of the gate insulating layer 20 in the second direction is equal to or more than 2 nm and equal to or less than 10 nm.

The thickness of the third portion 20c in a direction from the oxide semiconductor layer 16 toward the gate electrode 18 is, for example, equal to or more than 0.5 nm and equal to or less than 3 nm. For example, the thickness of the third portion 20c in the second direction is equal to or more than 0.5 nm and equal to or less than 3 nm.

The insulating layer 25 contains, for example, oxygen (O). The insulating layer 25 contains, for example, oxide.

The insulating layer 25 contains, for example, silicon (Si) and oxygen (O). The insulating layer 25 contains, for example, silicon oxide. The insulating layer 25 is, for example, a silicon oxide.

Next, the function and effect of the semiconductor device according to the fifth embodiment will be described.

An oxide semiconductor transistor in which a channel is formed in an oxide semiconductor layer has an excellent characteristic that the channel leakage current during off operation is very small. For this reason, for example, the oxide semiconductor transistor can be applied as a switching transistor of a memory cell in a DRAM. By applying the oxide semiconductor transistor as a switching transistor, the charge storage characteristic of the DRAM is improved.

For example, in order to improve the write/read speed of a DRAM, it is desired to increase the on-current of the switching transistor. There is a trade-off relationship between the threshold voltage and the on-current of the oxide semiconductor transistor. In other words, the on-current decreases as the threshold voltage of the oxide semiconductor transistor increases, and the on-current increases as the threshold voltage decreases.

The gate insulating layer 20 of the transistor 500 according to the fifth embodiment contains oxygen (O) and at least one metal element selected from a group consisting of aluminum (Al), hafnium (Hf), zirconium (Zr), lanthanum (La), yttrium (Y), zinc (Zn), indium (In), tin (Sn), and gallium (Ga).

In the transistor 500 according to the fifth embodiment, since the gate insulating layer 20 contains the above-described at least one metal element and oxygen (O), the trade-off between the threshold voltage and the on-current is improved. Therefore, it is possible to increase the on-current at a desired threshold voltage.

It is thought that the reason why the trade-off between the threshold voltage and the on-current is improved by the gate insulating layer 20 containing the above-described at least one metal element and oxygen (O) is that a fixed charge or dipole is formed in the gate insulating layer 20 to increase the threshold voltage of the transistor 500.

The gate insulating layer 20 of the transistor 500 according to the fifth embodiment preferably includes the first portion 20*a* containing silicon (Si) and oxygen (O). By providing the first portion 20*a*, for example, the trap level in the gate insulating layer 20 can be reduced. Therefore, for example, the gate leakage current of the transistor 500 can be reduced.

In addition, for example, by providing the first portion 20*a*, the interface state at the interface between the gate insulating layer 20 and the oxide semiconductor layer 16 can be reduced. Therefore, for example, the mobility of carriers is improved and the on-current of the transistor 300 is increased.

The gate insulating layer 20 of the transistor 500 according to the fifth embodiment preferably includes the second portion 20*b* containing silicon (Si) and nitrogen (N). By providing the second portion 20*b*, for example, the metal contained in the gate electrode 18 diffuses into the gate insulating layer 20. As a result, it is possible to suppress an increase in leakage current of the gate insulating layer 20 or a decrease in reliability of the gate insulating layer 20.

The gate insulating layer 20 of the transistor 500 according to the fifth embodiment preferably contains at least one element selected from a group consisting of nitrogen (N), carbon (C), hydrogen (H), and chlorine (Cl).

When the gate insulating layer 20 contains nitrogen (N) or carbon (C), for example, the diffusion of the metal contained in the gate electrode 18 into the gate insulating layer 20 is suppressed. As a result, it is possible to reduce the leakage current of the gate insulating layer 20 or improve the reliability of the gate insulating layer 20.

When the gate insulating layer 20 contains hydrogen (H) or chlorine (Cl), for example, the trap level in the gate insulating layer 20 is reduced. As a result, it is possible to reduce the leakage current of the gate insulating layer 20 or improve the reliability of the gate insulating layer 20.

Although the case where the above-described at least one metal element contained in the gate insulating layer 20 is aluminum (Al) has been mainly described, the same function and effect as in the case of aluminum (Al) can be realized even if the above-described at least one metal element is other than aluminum (Al).

In addition, although the case where the gate insulating layer 20 has a three-layer structure including the first portion 20*a*, the second portion 20*b*, and the third portion 20*c* has been described as an example, the gate insulating layer 20 is not limited to the three-layer structure described above. For example, the gate insulating layer 20 may have a single-layer structure, a two-layer structure, or a four-layer or more structure.

According to the transistor 500 according to the fifth embodiment, it is possible to increase the on-current at a desired threshold voltage.

As described above, according to the fifth embodiment, the on-current of the transistor increases at a desired threshold voltage. Therefore, a semiconductor device having excellent transistor characteristics is realized.

Sixth Embodiment

A semiconductor memory device according to a sixth embodiment includes the semiconductor device according to the fifth embodiment and a capacitor electrically connected to the first electrode or the second electrode.

The semiconductor memory device according to the sixth embodiment is a semiconductor memory 600. The semiconductor memory device according to the sixth embodiment is a DRAM. In the semiconductor memory 600, the transistor 500 according to the fifth embodiment is used as a switching transistor of a memory cell in a DRAM.

Hereinafter, the description of a part of the content overlapping the fifth embodiment will be omitted.

The equivalent circuit diagram of the semiconductor memory device according to the sixth embodiment is the same as that of the semiconductor memory device according to the second embodiment shown in FIG. 11. FIG. 11 illustrates a case where one memory cell MC is provided. However, for example, a plurality of memory cells MC may be provided in an array. In addition, a plurality of memory cells MC may be arranged three-dimensionally, for example.

As shown in FIG. 11, the semiconductor memory 600 includes the memory cell MC, a word line WL, a bit line BL, and a plate line PL. The memory cell MC includes a switching transistor TR and a capacitor CA.

The word line WL is electrically connected to the gate electrode of the switching transistor TR. The bit line BL is electrically connected to one of the source electrode and the drain electrode of the switching transistor TR. One electrode of the capacitor CA is electrically connected to the other one of the source electrode and the drain electrode of the switching transistor TR. The other electrode of the capacitor CA is electrically connected to the plate line PL.

The memory cell MC stores data by storing charges in the capacitor CA. Data is written and read by turning on the switching transistor TR.

For example, data is written into the memory cell MC by turning on the switching transistor TR in a state in which a desired voltage is applied to the bit line BL.

In addition, for example, a voltage change in the bit line BL according to the amount of charge stored in the capacitor is detected by turning on the switching transistor TR, thereby reading the data of the memory cell MC.

Figure 20:
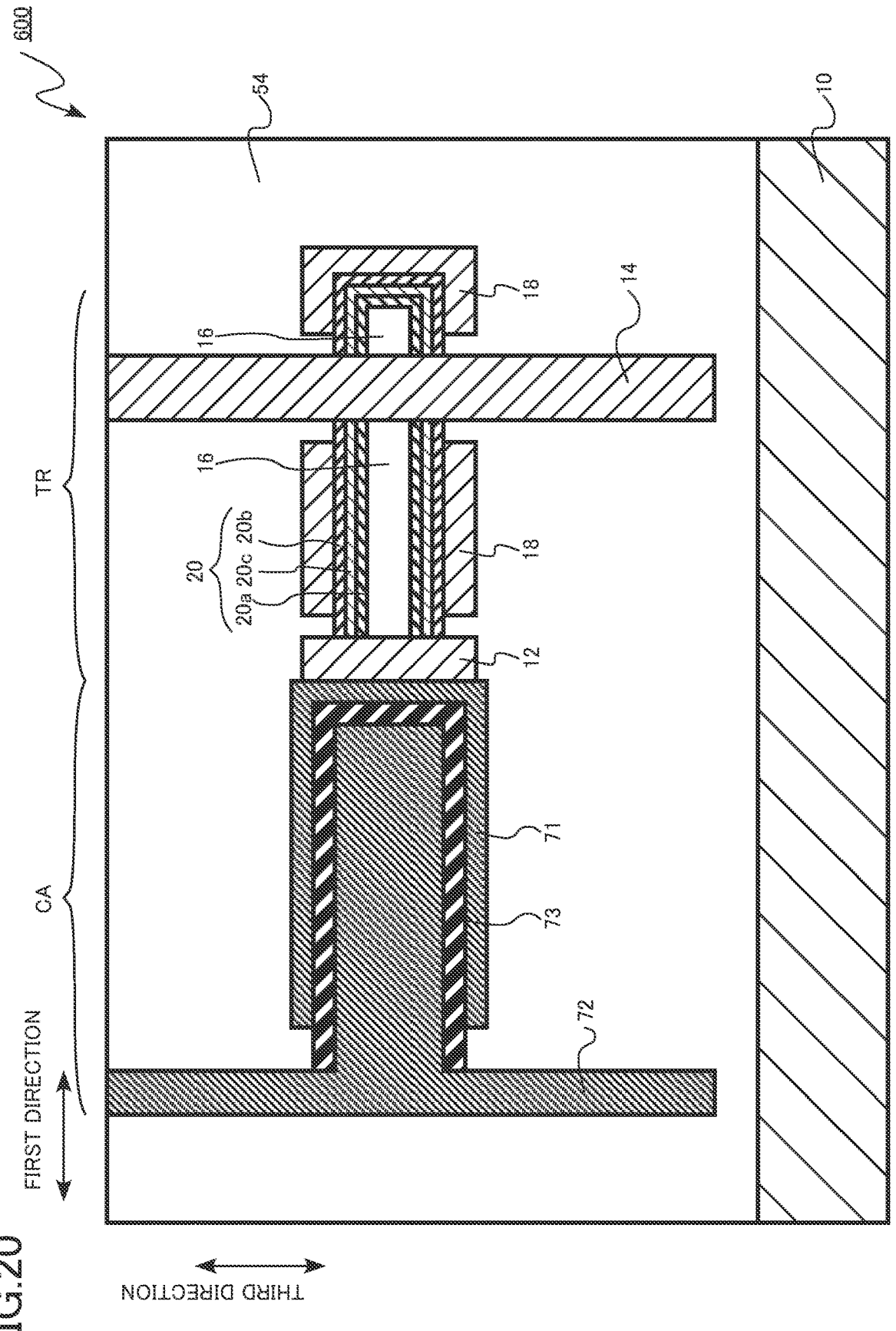
FIG. 20 is a schematic cross-sectional view of a semiconductor memory device according to a sixth embodiment.

FIG. 20 is a schematic cross-sectional view of the semiconductor memory device according to the sixth embodiment. FIG. 20 shows a cross section of the memory cell MC of the semiconductor memory 600.

The semiconductor memory 600 includes a silicon substrate 10, the switching transistor TR, the capacitor CA, and an interlayer insulating layer 54.

The silicon substrate 10 is, for example, single crystal silicon. The substrate may be, for example, a semiconductor substrate other than the silicon substrate. The substrate may be, for example, an insulating substrate.

The switching transistor TR includes a first electrode 12, a second electrode 14, an oxide semiconductor layer 16, a gate electrode 18, and a gate insulating layer 20. The gate insulating layer 20 includes a first portion 20a, a second portion 20b, and a third portion 20c.

The switching transistor TR has a structure similar to that of the transistor 500 according to the fifth embodiment.

The first direction from the first electrode 12 to the second electrode 14 is parallel to the surface of the silicon substrate 10, for example. The second electrode 14 extends, for example, in the third direction perpendicular to the surface of the silicon substrate 10.

The capacitor CA is provided in the first direction of the switching transistor TR. The capacitor CA is electrically connected to the first electrode 12.

The capacitor CA includes a cell electrode 71, a plate electrode 72, and a capacitor insulating film 73. The cell electrode 71 is electrically connected to the first electrode 12. The cell electrode 71 is in contact with, for example, the first electrode 12.

Each of the cell electrode 71 and the plate electrode 72 is, for example, a titanium nitride. The capacitor insulating film 73 has, for example, a stacked structure of zirconium oxide, aluminum oxide, and zirconium oxide.

The gate electrode 18 is electrically connected to, for example, the word line WL (not shown). The second electrode 14 is electrically connected to, for example, the bit line BL (not shown). The plate electrode 72 is connected to, for example, the plate line PL (not shown).

In the semiconductor memory 600, an oxide semiconductor transistor having a very small channel leakage current during off operation is applied as the switching transistor TR. Therefore, a DRAM having an excellent charge storage characteristic is realized.

In addition, the semiconductor memory 600 includes the switching transistor TR with increased on-current. Therefore, for example, a DRAM with improved write/read speed is realized.

For example, in FIG. 20, a plurality of memory cells MC having the common second electrode 14 and plate electrode 72 may be stacked in the third direction perpendicular to the surface of the silicon substrate 10.

As described above, according to the semiconductor memory 600 according to the sixth embodiment, the on-current of the switching transistor TR is increased. Therefore, a semiconductor memory device having excellent operating characteristics can be realized.

While certain embodiments have been described, these embodiments have been presented by way of example only, and are not intended to limit the scope of the inventions. Indeed, the semiconductor device and the semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

Technical aspects of the inventions will be described below. The technical aspects described below are within the scope of the inventions.

Clause 1. A semiconductor device, comprising:
a first electrode;
a second electrode;
an oxide semiconductor layer provided between the first electrode and the second electrode and electrically connected to the first electrode and the second electrode;
a gate electrode surrounding the oxide semiconductor layer; and
a gate insulating layer provided between the gate electrode and the oxide semiconductor layer, containing oxygen (O) and at least one metal element selected from a group consisting of aluminum (Al), hafnium (Hf), zirconium (Zr), lanthanum (La), yttrium (Y), zinc (Zn), indium (In), tin (Sn), and gallium (Ga), and having a chemical composition different from a chemical composition of the oxide semiconductor layer.

Clause 2. The semiconductor device according to clause 1,
wherein the oxide semiconductor layer surrounds the second electrode.

Clause 3. The semiconductor device according to clause 1,
wherein the gate insulating layer contains silicon (Si).

Clause 4. The semiconductor device according to clause 1,
wherein the gate insulating layer contains silicon (Si) and nitrogen (N).

Clause 5. The semiconductor device according to clause 1,
wherein the gate insulating layer includes a first portion containing silicon (Si) and oxygen (O), a second portion containing silicon (Si) and nitrogen (N), and a third portion provided between the first portion and the second portion and containing oxygen (O) and the at least one metal element, and
the first portion is provided between the oxide semiconductor layer and the second portion.

Clause 6. The semiconductor device according to clause 5,
wherein an atomic concentration of the at least one metal element in the third portion is higher than an atomic concentration of the at least one metal element in the first portion and the second portion, and
an atomic concentration of nitrogen (N) in the second portion is higher than an atomic concentration of nitrogen (N) in the first portion and the third portion.

Clause 7. The semiconductor device according to clause 6,
wherein a thickness of the third portion in a direction from the oxide semiconductor layer toward the gate electrode is equal to or less than 3 nm.

Clause 8. A semiconductor memory device, comprising:
the semiconductor device according to clause 1; and
a capacitor electrically connected to the first electrode or the second electrode.

What is claimed is:

1. A semiconductor device, comprising:

a first electrode;

a second electrode;

an oxide semiconductor layer provided between the first electrode and the second electrode and including a first region, a second region, and a third region disposed between the first region and the second region;

a gate electrode facing the third region;

a first insulating layer facing the first region;

a second insulating layer facing the second region; and a gate insulating layer provided between the gate electrode and the oxide semiconductor layer, between the first insulating layer and the oxide semiconductor layer, and between the second insulating layer and the oxide semiconductor layer, containing oxygen (O) and at least one metal element selected from a group consisting of aluminum (Al), hafnium (Hf), zirconium (Zr), lanthanum (La), yttrium (Y), zinc (Zn), indium (In), tin (Sn), and gallium (Ga), and having a chemical composition different from a chemical composition of the oxide semiconductor layer, wherein at least one of the first region and the second region includes a high resistance portion having an electrical resistance higher than an electrical resistance of the third region.

2. The semiconductor device according to claim 1, wherein the first region includes a low resistance portion provided between the high resistance portion and the first electrode, or the second region includes a low resistance portion provided between the high resistance portion and the second electrode, and an electrical resistance of the low resistance portion is lower than the electrical resistance of the third region.

3. The semiconductor device according to claim 1, wherein the gate insulating layer contains silicon (Si).

4. The semiconductor device according to claim 1, wherein the gate insulating layer contains silicon (Si) and nitrogen (N).

5. The semiconductor device according to claim 4, wherein an atomic concentration of nitrogen in the gate insulating layer provided between the first insulating layer and the oxide semiconductor layer is lower than an atomic concentration of nitrogen in the gate insulating layer provided between the gate electrode and the oxide semiconductor layer, or an atomic concentration of nitrogen in the gate insulating layer provided between the second insulating layer and the oxide semiconductor layer is lower than an atomic concentration of nitrogen in the gate insulating layer provided between the gate electrode and the oxide semiconductor layer.

6. The semiconductor device according to claim 4, wherein a ratio of an atomic concentration of the at least one metal element to an atomic concentration of nitrogen in the gate insulating layer provided between the first insulating layer and the oxide semiconductor layer is higher than a ratio of an atomic concentration of the at least one metal element to an atomic concentration of nitrogen in the gate insulating layer provided between the gate electrode and the oxide semiconductor layer, or a ratio of an atomic concentration of the at least one metal element to an atomic concentration of nitrogen in the gate insulating layer provided between the second insulating layer and the oxide semiconductor layer is higher than a ratio of an atomic concentration of the at least one metal element to an atomic concentration of nitrogen in the gate insulating layer provided between the gate electrode and the oxide semiconductor layer.

7. The semiconductor device according to claim 1, wherein the gate insulating layer includes a first portion containing silicon (Si) and oxygen (O), a second portion containing silicon (Si) and nitrogen (N), and a third portion provided between the first portion and the second portion and containing oxygen (O) and the at least one metal element, and the first portion is provided between the oxide semiconductor layer and the second portion.

8. The semiconductor device according to claim 7, wherein an atomic concentration of the at least one metal element in the third portion is higher than an atomic concentration of the at least one metal element in the first portion and the second portion, and an atomic concentration of nitrogen (N) in the second portion is higher than an atomic concentration of nitrogen (N) in the first portion and the third portion.

9. The semiconductor device according to claim 7, wherein a thickness of the third portion in a direction from the oxide semiconductor layer toward the gate electrode is equal to or less than 3 nm.

10. The semiconductor device according to claim 1, wherein the gate insulating layer contains at least one element selected from a group consisting of nitrogen (N), carbon (C), hydrogen (H), and chlorine (Cl).

11. The semiconductor device according to claim 1, wherein the gate electrode surrounds the third region, the first insulating layer surrounds the first region, and the second insulating layer surrounds the second region.

12. A semiconductor memory device, comprising:

the semiconductor device according to claim 1; and a capacitor electrically connected to the first electrode or the second electrode.

13. A semiconductor device, comprising:

a first electrode;

a second electrode;

an oxide semiconductor layer provided between the first electrode and the second electrode and electrically connected to the first electrode and the second electrode;

a gate electrode surrounded by the oxide semiconductor layer; and a gate insulating layer provided between the gate electrode and the oxide semiconductor layer, containing oxygen (O) and at least one metal element selected from a group consisting of aluminum (Al), hafnium (Hf), zirconium (Zr), lanthanum (La), yttrium (Y), zinc (Zn), indium (In), tin (Sn), and gallium (Ga), and having a chemical composition different from a chemical composition of the oxide semiconductor layer.

14. The semiconductor device according to claim 13, wherein the gate insulating layer contains silicon (Si).

15. The semiconductor device according to claim 13, wherein the gate insulating layer contains silicon (Si) and nitrogen (N).

16. The semiconductor device according to claim 13, wherein the gate insulating layer includes a first portion containing silicon (Si) and oxygen (O), a second portion containing silicon (Si) and nitrogen (N), and a third portion provided between the first portion and the second portion and containing oxygen (O) and the at least one metal element, and the first portion is provided between the oxide semiconductor layer and the second portion.

17. The semiconductor device according to claim 16,
wherein an atomic concentration of the at least one metal
   element in the third portion is higher than an atomic
   concentration of the at least one metal element in the
   first portion and the second portion, and
an atomic concentration of nitrogen (N) in the second
   portion is higher than an atomic concentration of nitro-
   gen (N) in the first portion and the third portion.

18. The semiconductor device according to claim 16,
wherein a thickness of the third portion in a direction from
   the oxide semiconductor layer toward the gate elec-
   trode is equal to or less than 3 nm.

19. A semiconductor memory device, comprising:
the semiconductor device according to claim 13; and
a capacitor electrically connected to the first electrode or
   the second electrode.

* * * * *